(12) United States Patent
Im et al.

(10) Patent No.: US 10,067,825 B2
(45) Date of Patent: Sep. 4, 2018

(54) MEMORY DEVICE AND METHOD OF CONTROLLING ECC OPERATION IN THE SAME

(71) Applicant: SAMSUNG ELECTRONICS CO., LTD., Suwon-si, Gyeonggi-Do (KR)

(72) Inventors: Jae-Woo Im, Yongin-si (KR); Sang-Hyun Joo, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/061,349

(22) Filed: Mar. 4, 2016

(65) Prior Publication Data
US 2017/0075757 A1    Mar. 16, 2017

(30) Foreign Application Priority Data

Sep. 14, 2015 (KR) .................. 10-2015-0129692
Dec. 1, 2015 (KR) .................. 10-2015-0169706

(51) Int. Cl.
*G06F 11/10* (2006.01)
*G06F 3/06* (2006.01)
*G11C 29/52* (2006.01)

(52) U.S. Cl.
CPC .......... *G06F 11/1068* (2013.01); *G06F 3/064* (2013.01); *G06F 3/0619* (2013.01); *G06F 3/0679* (2013.01); *G11C 29/52* (2013.01)

(58) Field of Classification Search
CPC ...... G06F 11/10; G06F 11/1068; G06F 3/064; G06F 3/0619; G06F 3/0679; G06F 11/1072; G11C 29/42; G11C 29/52
See application file for complete search history.

(56) References Cited

U.S. PATENT DOCUMENTS

| | | | | |
|---|---|---|---|---|
| 7,096,406 B2 * | 8/2006 | Kanazawa | .......... | G06F 11/1072 360/53 |
| 7,830,711 B2 | 11/2010 | Kawamoto et al. | | |
| 8,711,624 B2 * | 4/2014 | Choi | .................. | G11C 11/5621 365/185.09 |

(Continued)

FOREIGN PATENT DOCUMENTS

| | | |
|---|---|---|
| JP | 2011-109025 | 6/2011 |
| KR | 1020070109429 | 11/2007 |

*Primary Examiner* — Shelly A Chase
(74) *Attorney, Agent, or Firm* — F. Chau & Associates, LLC

(57) ABSTRACT

A memory cell array includes memory cells that are formed in vertical channels extended in a vertical direction with respect to a substrate. The vertical channels are arranged in a zig-zag manner in parallel to the first direction. A read-write circuit is connected to the memory cells via bit lines. An address decoder decodes an address to provide decoded address signals to the read-write circuit. The memory cells include outer cells and inner cells. A distance between one of the outer cells and a common source node is smaller than a distance between one of the inner cells and the common source node. Data of the memory cells are distributed among ECC sectors and a data input-output order of the memory cells is arranged such that each ECC sector has substantially the same number of the outer cells and the inner cells. Each ECC sector corresponds to an ECC operation unit.

18 Claims, 38 Drawing Sheets

(56) References Cited

U.S. PATENT DOCUMENTS

| | | | |
|---|---|---|---|
| 8,869,008 B2* | 10/2014 | Baum | G06F 11/1008 |
| | | | 714/773 |
| 2014/0317469 A1 | 10/2014 | Sohn et al. | |
| 2015/0067448 A1 | 3/2015 | Son et al. | |
| 2015/0199234 A1 | 7/2015 | Choi et al. | |
| 2016/0110252 A1* | 4/2016 | Hyun | G11C 29/52 |
| | | | 714/766 |

* cited by examiner

FIG. 10

| A2 | A1 A0 | L0 L1 | Y0 Y1 Y2 Y3 |
|---|---|---|---|
| 0 | 0 0 | H L | H L L L |
| 0 | 0 1 | H L | L H L L |
| 0 | 1 0 | H L | L L H L |
| 0 | 1 1 | H L | L L L H |
| 1 | 0 0 | L H | H L L L |
| 1 | 0 1 | L H | L H L L |
| 1 | 1 0 | L H | L L H L |
| 1 | 1 1 | L H | L L L H |

| A2 | A1 A0 | A2'<br>(A0) | A1' A0'<br>(A2 A1) | L0 L1 | Y0 Y1 Y2 Y3 |
|---|---|---|---|---|---|
| 0 | 0 0 | 0 | 0 0 | H L | H L L L |
| 0 | 0 1 | 1 | 0 0 | L H | H L L L |
| 0 | 1 0 | 0 | 0 1 | H L | L H L L |
| 0 | 1 1 | 1 | 0 1 | L H | L H L L |
| 1 | 0 0 | 0 | 1 0 | H L | L L H L |
| 1 | 0 1 | 1 | 1 0 | L H | L L H L |
| 1 | 1 0 | 0 | 1 1 | H L | L L L H |
| 1 | 1 1 | 1 | 1 1 | L H | L L L H |

US 10,067,825 B2

MEMORY DEVICE AND METHOD OF CONTROLLING ECC OPERATION IN THE SAME

CROSS-REFERENCE TO RELATED APPLICATIONS

This application claims priority under 35 USC § 119 to Korean Patent Application No. 10-2015-0129692, filed on Sep. 14, 2015 and Korean Patent Application No. 10-2015-0169706, filed on Dec. 1, 2015, in the Korean Intellectual Property Office (KIPO), the disclosures of which are incorporated by reference herein in their entirety.

TECHNICAL FIELD

The present inventive concept relates to semiconductor integrated circuits, and a method of controlling an error check and correction (ECC) operation and a memory device performing the method.

DISCUSSION OF RELATED ART

Semiconductor memory devices for storing data may be classified into volatile memory devices and non-volatile memory devices. Volatile memory devices, such as dynamic random access memory (DRAM) devices, are typically configured to store data by charging or discharging capacitors in memory cells, and lose the stored data when power is off. Non-volatile memory devices, such as flash memory devices, may maintain stored data even though power is off. Volatile memory devices are widely used as main memories of various apparatuses, while non-volatile memory devices are widely used for storing program codes and/or data in various electronic devices, such as computers, mobile devices, etc.

Memory capacity of semiconductor memory devices is increasing according to developments of manufacturing processes. As integration degree of semiconductor memory devices increases, the number of defective memory cells increases and yield of semiconductor memory devices decreases. Redundant memory cells may be used or an ECC operation may be performed to repair defective memory cells. Yield and performance of semiconductor memory devices may depend on efficiency of such repairing scheme.

SUMMARY

A non-volatile memory device is provided as follows. A memory cell array includes memory cells that are formed in vertical channels extended in a vertical direction with respect to a substrate. The vertical channels are arranged in a zig-zag manner in parallel to the first direction. A read-write circuit is connected to the memory cells via bit lines. An address decoder decodes an address to provide decoded address signals to the read-write circuit. The memory cells include outer cells and inner cells. A distance between one of the outer cells and a common source node is smaller than a distance between one of the inner cells and the common source node. Data of the memory cells are distributed among ECC sectors and a data input-output order of the memory cells is arranged such that each ECC sector has substantially the same number of the outer cells and the inner cells. Each ECC sector corresponds to an ECC operation unit.

A memory device is provided as follows. A memory cell array includes memory cells. A read-write circuit is connected to the memory cells via bit lines. An address decoder decodes an address to provide decoded address signals to the read-write circuit. The memory cells include cell groups based on cell characteristics. Memory cells of each cell group has the same cell characteristics. Data of the memory cells are distributed among ECC sectors. A data input-output order of the memory cells is arranged such that each ECC sector has substantially the same number of memory cells of each cell group. Each ECC sector corresponds to an ECC operation unit.

A method of operating an error check and correction (ECC) on a memory device is provided as follows. N bits are received from N memory cells of the memory device as an ECC operation unit. Each of the N memory cells has one cell characteristic of N cell characteristics and the ECC operation unit has substantially the same number of bits for each cell characteristics. An ECC algorithm is performed on the N bits.

BRIEF DESCRIPTION OF DRAWINGS

These and other features of the inventive concept will become more apparent by describing in detail exemplary embodiments thereof with reference to the accompanying drawings of which:

FIG. 10 is a diagram illustrating decoded address signals provided to the read-write circuit of FIG. 9 according to an exemplary embodiment;

Figure 1:
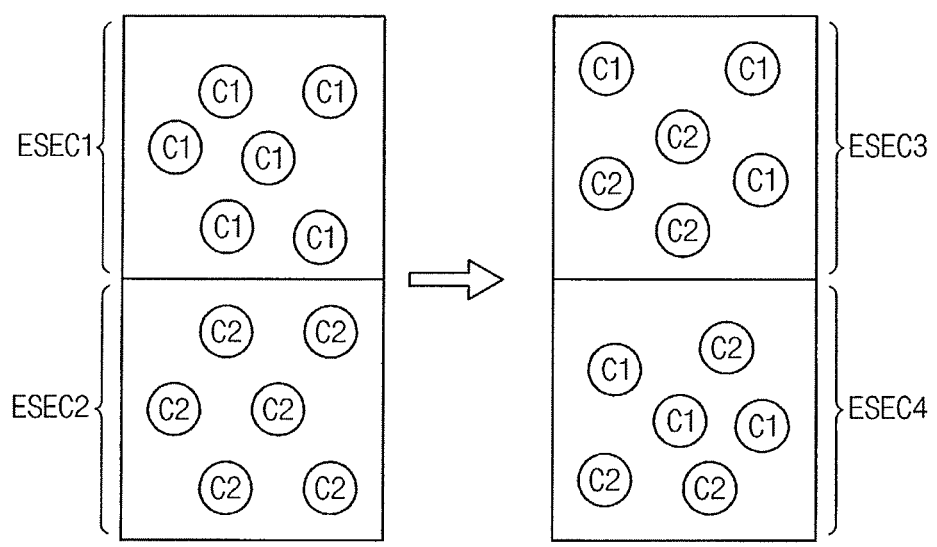
FIG. 1 is a diagram illustrating configuration of error check and correction (ECC) sectors according to an exemplary embodiment.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EXEMPLARY EMBODIMENTS

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. In an embodiment of the present inventive concept, the 3D memory array includes vertical NAND strings that are vertically oriented such that at least one memory cell is located over another memory cell. The at least one memory cell may comprise a charge trap layer. The following patent documents, which are hereby incorporated by reference, describe suitable configurations for three dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 2:
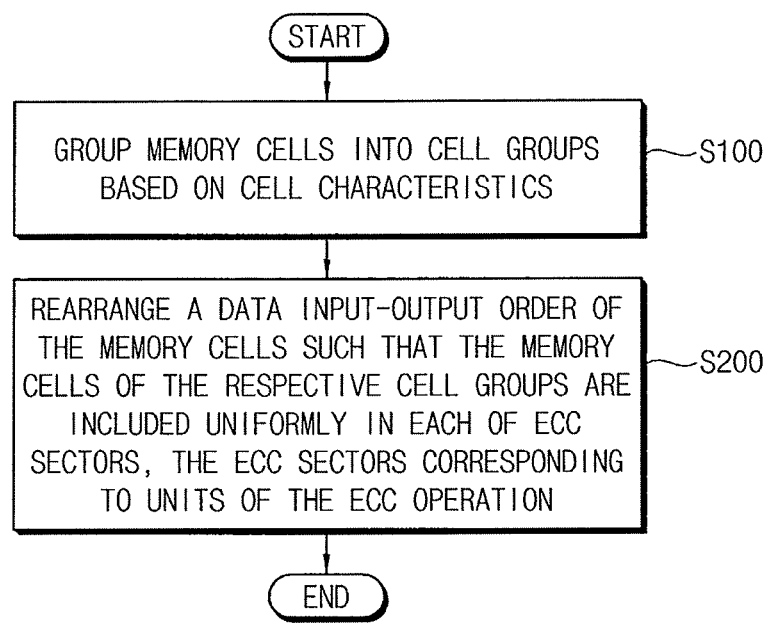
FIG. 2 is a flow chart illustrating a method of controlling an ECC operation in a memory device according to an exemplary embodiment.

FIG. 1 is a diagram illustrating configuration of error check and correction (ECC) sectors according to an exemplary embodiment, and FIG. 2 is a flow chart illustrating a method of controlling an ECC operation in a memory device according to an exemplary embodiment.

Referring to FIGS. 1 and 2, memory cells are grouped into cell groups based on cell characteristics (S100). For example, as illustrated in FIG. 1, the memory cells may be grouped into first memory cells C1 and second memory cells C2 based on cell characteristics. The cell characteristics for grouping the memory cells may include at least one of various characteristics depending on memory cell structure itself, depending on relation (distance) between the memory cells and neighboring structures, depending on degeneration degree of the memory cells by repeated read and write operations, etc. FIG. 1 illustrates a non-limiting example that the memory cells are grouped into the two groups of the first memory cells C1 and the second memory cells C2, but the memory cells may be grouped three or more groups.

A data input-output order of the memory cells is arranged such that the memory cells of the respective cell groups may be included uniformly in each of ECC sectors, where the ECC sectors correspond to units of the ECC operation (S200). As illustrated in FIG. 1, a first ECC sector ESEC1 may include only the first memory cells C1 and a second ECC sector ESEC2 may include only the second memory cells C2. In contrast, each of a third ECC sector ESEC3 and a fourth ECC sector ESEC4 may include the first memory cells C1 and the second memory cells C2 uniformly. The first and second ECC sectors ESEC1 and ESEC2 may be changed to the third and fourth ECC sectors ESEC3 and ESEC4 by rearranging the data input-output order.

Here "uniformly included" may represent a case that the number of the first memory cells C1 and the number of the second memory cells C2 included in one ECC sector is very similar or substantially the same, in addition to a case that the numbers are exactly the same. In other words, when the number of the first memory cells C1 in one ECC sector is N1 and the number of the second memory cells C2 in the one ECC sector is N2, the first memory cells C1 and the second memory cells C2 may be considered as being uniformly included in the one ECC sector if $|N1-N2|/(N1+N2)=K$ is a sufficiently small value. For example, K may be set to be a value between 0 and 0.1.

In an exemplary embodiment, the inventive concept of this disclosure may be applied to a vertical NAND flash memory device or a three-dimensional NAND flash memory device. Compared with a planar NAND flash, the three-dimensional NAND flash having the vertical channels may include the memory cells of different structural characteristics. For example, as will be described with reference to FIGS. 7 and 8, the memory cells of the three-dimensional NAND flash may include outer cells and inner cells such that a distance between the outer cell and a common source node is smaller than a distance between the inner cell and the common source node. The difference of the distances to the common source node may result in the difference of operational characteristics of the memory cells, for example, the difference of degeneration degree of the memory cells by the program and erase (P/E) cycle. If an ECC operation is performed without considering the differences of the cell characteristics, each logical ECC sector may be populated with the same cell characteristics. In this case, a maximum error bit level or the maximum number of the error bits in each ECC sector is determined by the worse characteristic among the outer cells and the inner cells.

According to an exemplary embodiment, the maximum error bit level may be decreased by rearranging the data input-output order so that the memory cells having the worse characteristic may be gathered in the same ECC sector. For example, it may be assumed that the error bit level of the outer cells is 20 bits per 1 KB (kilo byte) and the error bit level of the inner cells is 10 bits per 1 KB. In this case, the maximum error bit level of the entire ECC sectors may be 20 bits per 1 KB for the first ECC sector ESEC1 and the second ECC sector ESEC2 in FIG. 1. If the data input-output order is arranged so that each ECC sector such as the third ECC sector ESEC3 and the fourth ECC sector ESEC4 in FIG. 1 may include the first memory cells C1 and the second memory cells C2 uniformly, the maximum error bit level may be decreased to 15 bit per 1 KB.

As such, the method of controlling the ECC operation in the memory device according to an exemplary embodiment may decrease the maximum error bit level of the ECC sector by uniformalizing error bit levels according to cell characteristics. Through decrease of the maximum error bit level, repair rate of the bad memory devices may be increased and thus yield, performance and lifetime of the memory devices may be increased.

Figure 3:
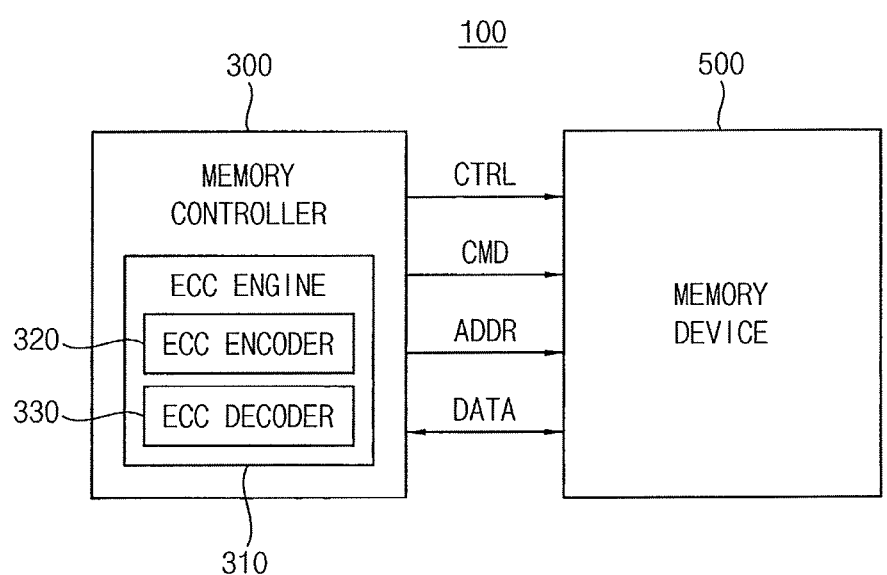
FIG. 3 is a block diagram illustrating a memory system according to an exemplary embodiment.

FIG. 3 is a block diagram illustrating a memory system according to an exemplary embodiment.

Referring to FIG. 3, a memory system 100 may include a memory controller 300 and at least one memory device 500.

The memory device 500 may perform read, write and erase operations under control of the memory controller 300. The memory device 500 may receive control signals CTRL, commands CMD, addresses ADDR and write data DATA from the memory controller 300 and transmit read data DATA to the memory controller 300.

The memory controller 300 may include an ECC engine 310. The ECC engine 310 may include an ECC encoder 320 and an ECC decoder as illustrated in FIG. 3 to check and correct error bits. The ECC engine may perform the ECC operation on data units of the ECC sectors. For example, the data unit of a page may be 8 KB though 64 KB and the data unit of the ECC sector may be 1 KB through 4 KB.

The ECC encoder 320 may perform error correction encoding of the data to be provided to the memory device 500 to generate a codeword including parity bits. The codeword may be transferred to and stored in the memory device 500. The ECC encoder 320 may perform the encoding by data units of ECC sectors. The ECC decoder 330 may perform error correction decoding of the data read out from the memory device 500 and determine fail or success of the error correction decoding. The ECC decoder 330 may correct the error bits of the data using the parity bits in the codeword. If the error bit number exceeds the threshold number or the correctible bit number, the ECC decoder 330 cannot correct the error bits and the error correction is determined to be impossible. According to an exemplary embodiment, the error bit levels according to cell characteristics may be uniformalized, thereby reducing the maximum error bit level and probability of error correction fail.

In an exemplary embodiment, the ECC encoder 320 and the ECC decoder 330 may check and correct bit errors using coded modulations such as low density parity check (LPC) code, Bose, Chaudhuri, Hocquenghem (BCH) code, turbo code, Reed-Solomon code (RSC), convolution code, recursive systematic code, trellis-coded modulation (TCM), block coded modulation (BCM), etc.

Figure 4:
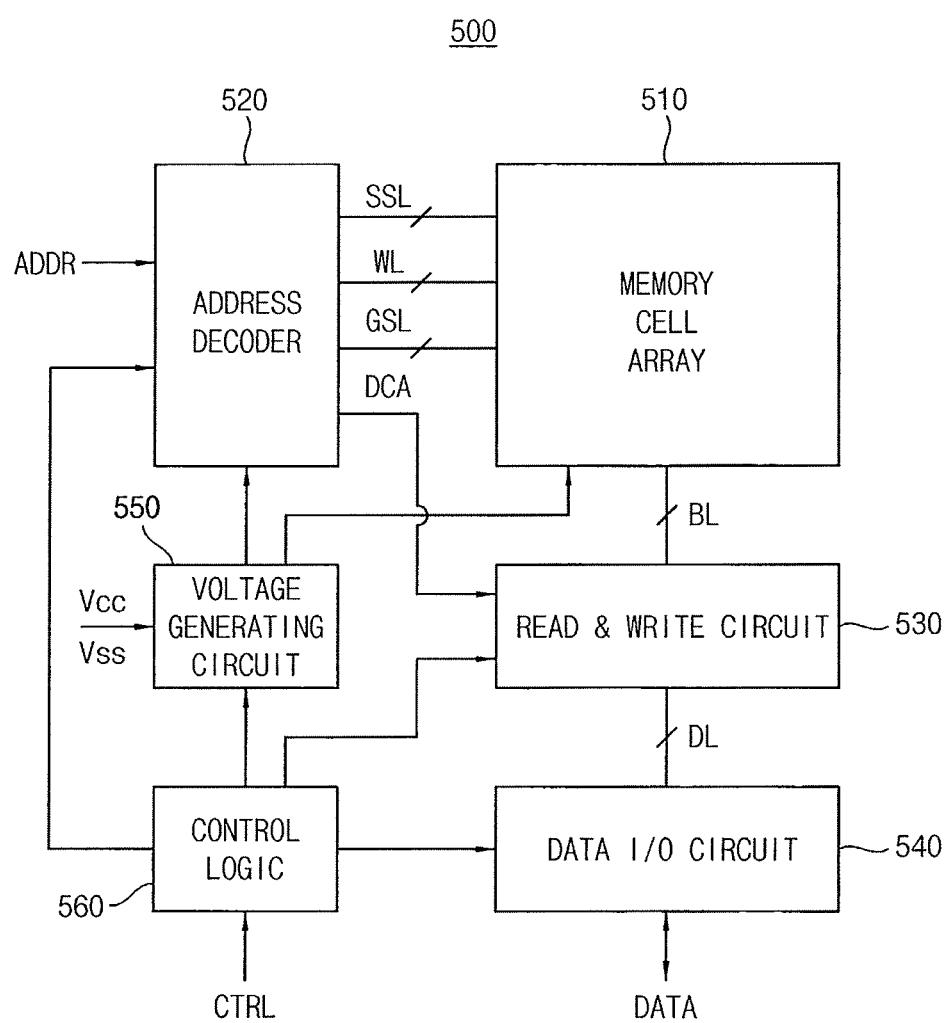
FIG. 4 is a block diagram illustrating a memory device according to an exemplary embodiment.

FIG. 4 is a block diagram illustrating a memory device according to an exemplary embodiment.

Referring to FIG. 4, a memory device 500 includes a memory cell array 510, an address decoder 520, a read-write circuit 530, a data input/output (I/O) circuit 540, a voltage generating circuit 550, and a control logic 560.

The memory cell array 510 is connected to the address decoder 520 through word lines WL and selection lines. For example, the selection lines may include string selection lines SSL and ground selection lines GSL. The memory cell array 510 is connected to the read-write circuit 530 through bit lines BL.

Figure 5:
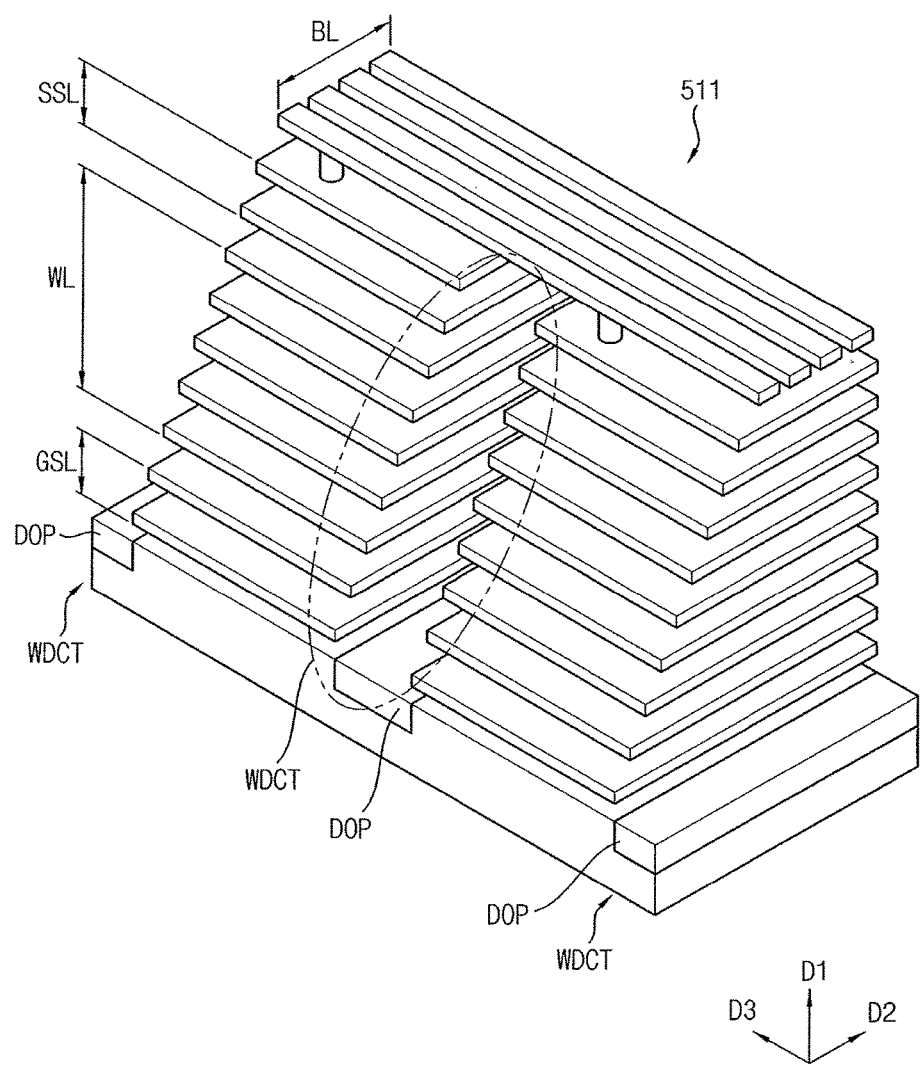
FIG. 5 is a perspective view of an example of a memory cell array included in the memory device of FIG. 4.
Figure 6:
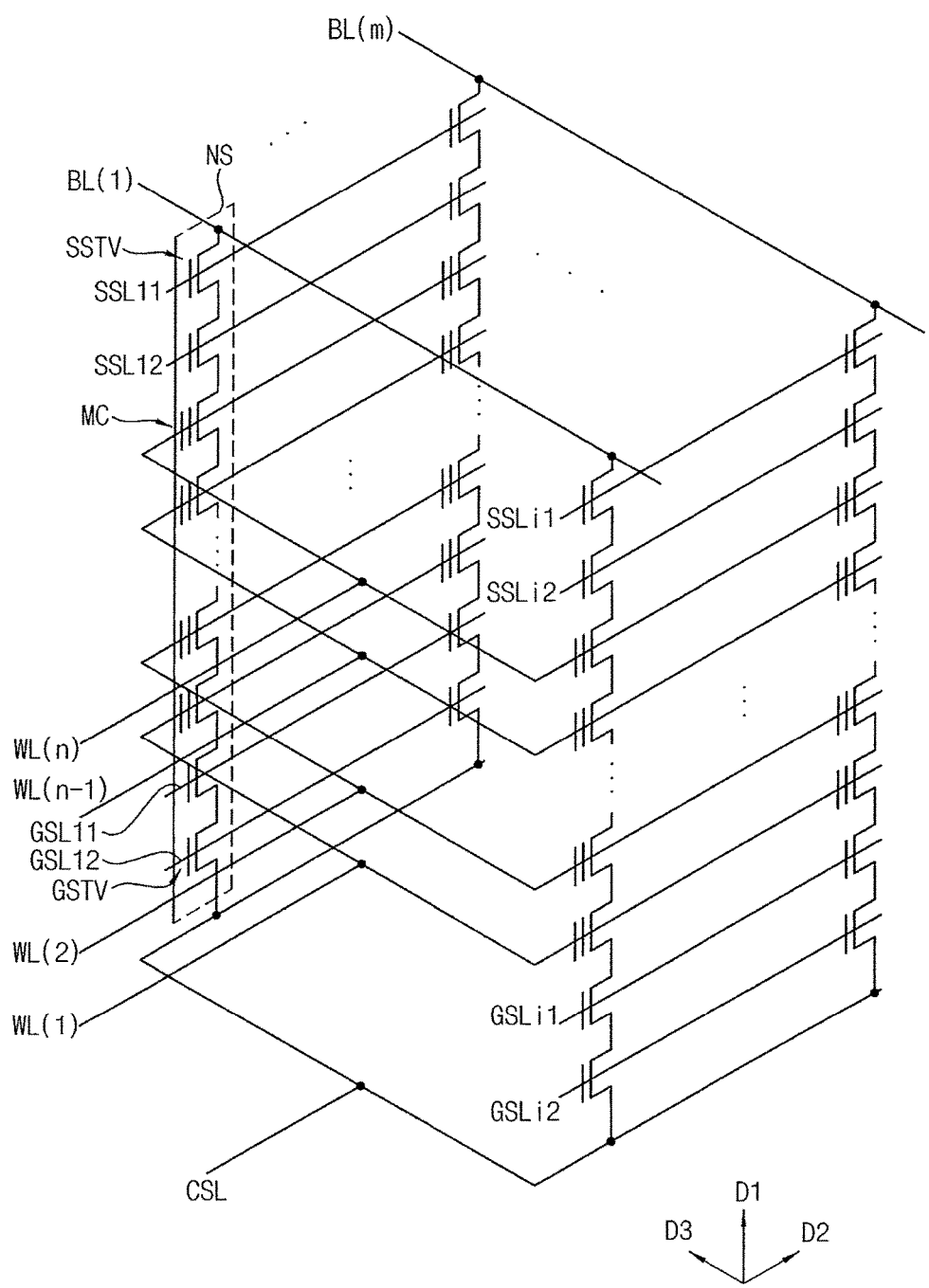
FIG. 6 is a circuit diagram illustrating an example of a memory cell array included in the memory device of FIG. 4.
Figure 7:
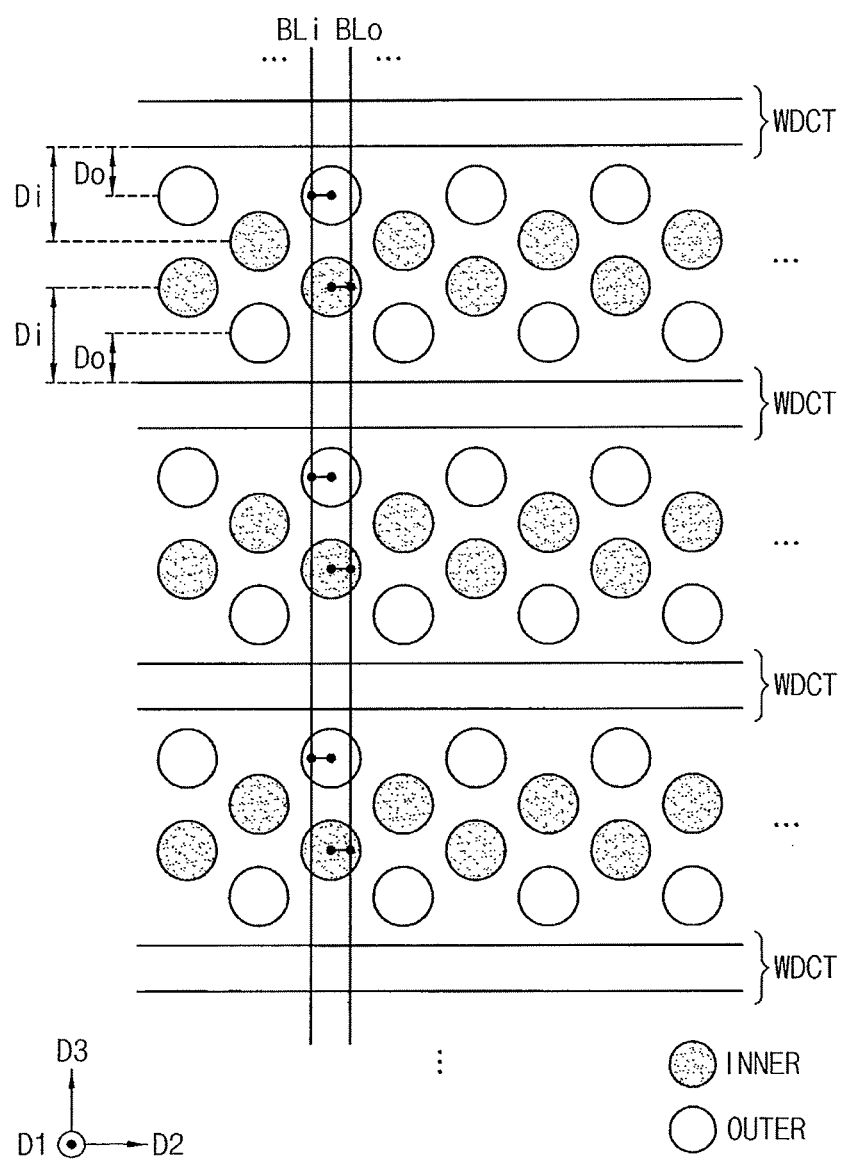
FIG. 7 is a top view of an example of a memory cell array included in the memory device of FIG. 4.

The memory cell array 510 may include a plurality of memory cells. For example, the memory cell array 510 includes memory cells disposed along row and column directions. For example, the memory cell array 510 includes a plurality of memory cells, each cell storing one or more data bits. The memory cell array may have a vertical NAND flash structure as illustrated in FIGS. 5, 6 and 7.

The address decoder 520 is connected to the memory cell array 510 through word lines WL, string selection lines SSL, and ground selection lines GSL. The address decoder 520 is configured to operate in response to a control of the control logic 560. The address decoder 520 receives addresses ADDR from an external device such as a memory controller.

The address decoder 520 is configured to decode a row address among the received addresses ADDR. The address decoder 520 is configured to select a word line corresponding to the decoded row address among the word lines WL. The address decoder 520 is configured to select selection lines corresponding to the decoded row address among the selection lines including string selection lines SSL and ground selection lines GSL.

The address decoder 520 is configured to deliver various voltages received from the voltage generating circuit 550 to the selected word line, unselected word line, selected selection line, and unselected selection line.

The address decoder 520 is configured to decode a column address among the received address ADDR. The address decoder 520 delivers the decoded column address DCA to the read-write circuit 530.

In an exemplary embodiment, the address decoder 520 may include a row decoder decoding a row address, a column decoder decoding a column address, and an address buffer storing a received address ADDR.

The read-write circuit 530 is connected to the memory cell array 510 through bit lines BL, and is connected to the data I/O circuit 540 through data lines DL. The read-write circuit 530 operates in response to a control of the control logic 560. The read-write circuit 530 receives a decoded column address DCA from the address decoder 520. Using the decoded column address DCA, the read-write circuit 530 selects bit lines BL.

The read-write circuit 530 receives data from the data I/O circuit 540, and writes received data to the memory cell array 510. The read-write circuit 530 reads data from the memory cell array 510 and delivers the read data to the data I/O circuit 540.

In an exemplary embodiment, the read-write circuit 530 may include a page buffer (or page register) and a column selection circuit. In an exemplary embodiment, the read-write circuit 530 may further include a sense amplifier, a write driver, and a column selection circuit.

The data I/O circuit 540 is connected to the read-write circuit 530 through data lines DL. The data I/O circuit 140 operates in response to a control of the control logic 560. The data I/O circuit 540 is configured to exchange data DATA with the external. The data I/O circuit 540 is configured to deliver data DATA from the external to the read-write circuit 530 through data lines DL. The data I/O circuit 540 is configured to output data DATA delivered from the read-write circuit 530 through data lines DL to the external. In an exemplary embodiment, the data I/O circuit 540 may include a data buffer.

The voltage generating circuit 550 is connected to the memory cell array 510, the address decoder 520, and the control logic 560. The voltage generating circuit 550 receives power from the external. In an exemplary embodiment, the voltage generating circuit 550 receives a power voltage Vcc and a ground voltage Vss from the external. In response to a control of the control logic 560, the voltage generating circuit 550 is configured to generate voltages having various voltage levels from the power voltage Vcc and the ground voltage Vss. In an exemplary embodiment, the voltage generating circuit 550 is configured to generate various voltages such as a high voltage VPP, a program voltage Vpgm, a pass voltage Vpass, a read voltage Vread, and an erase voltage Vers.

Voltages generated by the voltage generating circuit 550 are supplied to the address decoder 520 and the memory cell array 510 under a control of the control logic 560. For example, a program voltage Vpgm and a pass voltage Vpass may be supplied to the address decoder 520 during a program operation. During a read operation, a read voltage Vread may be supplied to the address decoder 520. During erasing the memory cell array 510, an erase voltage Vers may be supplied to the memory cell array 510. Voltages generated by the voltage generating circuit 550 are not limited to the above-mentioned voltages.

The control logic 560 is connected to the address decoder 520, the read-write circuit 530, the pass/fail check circuit 160, and the data I/O circuit 540. The control logic 560 is configured to control general operations of the nonvolatile memory device 100a. The control logic 560 operates in response to a control signal CTRL delivered from the external device.

FIG. 5 is a perspective view of a memory cell array included in the memory device of FIG. 4 according to an exemplary embodiment, and FIG. 6 is a circuit diagram of a memory cell array included in the memory device of FIG. 4 according to an exemplary embodiment. In FIGS. 5 and 6, a first direction D1 may refer to a vertical direction, a second direction D2 may refer to a row direction and a third direction D3 may refer to a column direction.

Referring to FIG. 5, a memory cell array 511 may be implemented such that at least one ground selection line GSL, a plurality of word lines WL and at least one string selection line SSL are stacked on a substrate between word line cut regions WDCT. Doping regions DOP may be formed in top portions of the substrate of the word line cut regions WDCT. The doping region may be used as common source lines CSL or common source nodes CSN to which a common source voltage is applied.

A plurality of vertical channels penetrate the at least one ground selection lines GSL, the plurality of word lines WL and the at least one string selection lines SSL. The at least one ground selection lines GSL, the plurality of word lines WL and the at least one string selection lines SSL may be formed in the shape of planks. Bit lines BL are connected to top surfaces of the vertical channels.

Referring to FIG. 6, a memory cell array 512 may include a plurality of NAND strings NS each of which has a vertical structure. The plurality of NAND strings NS may be formed in a second direction D2 to define a string column, and a plurality of string columns may be formed in a third direction D3 to define a string array. Each NAND string NS may include string selection transistors SSTV, ground selection transistors GSTV, and a plurality of memory cells MC that are formed in a first direction D1 and are connected in series between the string selection transistors SSTV and the ground selection transistors GSTV.

The string selection transistors SSTV may be connected to bit lines BL(1)~BL(m), and the ground selection transistors GSTV may be connected to a common source line CSL. The string selection transistors SSTV may be connected to string select lines SSL11, SSL12, SSLi1, SSLi2, and the ground selection transistors GSTV may be connected to ground selection lines GSL11, GSL12, GSLi1, GSLi2. The memory cells in the same layer may be connected to the same word-line among word-lines WL(1)~WL(n). Each string selection line and each ground selection line may extend in the second direction D2, and the string selection lines SSL11~SSLi2 and the ground selection lines GSL11~GSLi2 may be arranged along the third direction D3. Each word-line may extend in the second direction D2, and the word-lines WL(1)~WL(n) may be formed in the first direction D1 and the third direction D3. Each bit-line may extend in the third direction D3, and the bit-lines BL(1)~BL(m) may be arranged along the second direction D2. The memory cells MC may be controlled by a voltage on the word-lines WL(1)~WL(n).

The vertical or three-dimensional flash memory device may perform the read operation and the write operation in a page unit and may perform the erase operation in a block unit.

In an exemplary embodiment, two string selection transistors included in a single NAND string may be connected to a single string selection line, and two ground selection transistors included in the single NAND string may be connected to a single ground selection line. In an exemplary embodiment, the single NAND string may include one string selection transistor and one ground selection transistor.

Figure 8:
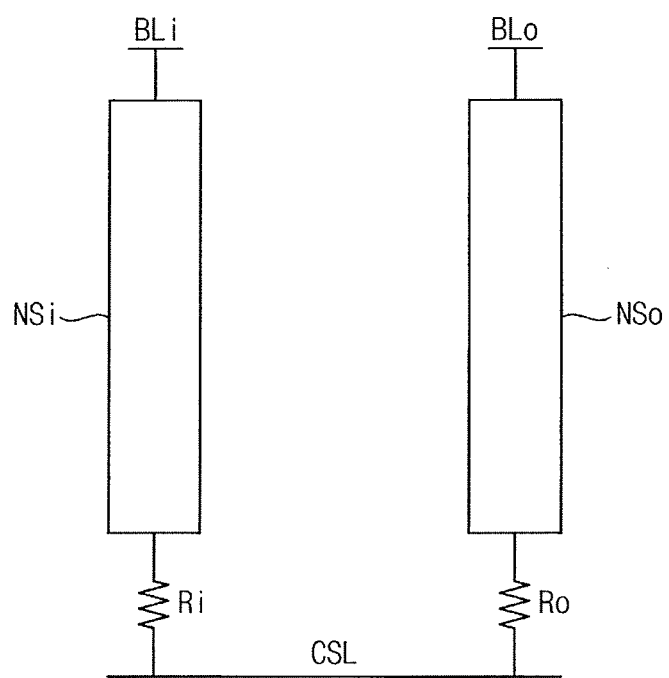
FIG. 8 is a diagram illustrating a connection of NAND strings included in the memory cell array of FIG. 7.

FIG. 7 is a top view of a memory cell array included in the memory device of FIG. 4, and FIG. 8 is a diagram illustrating a connection of NAND strings included in the memory cell array of FIG. 7.

In FIG. 7, shaded circles represent inner vertical channels and blank circles represent outer vertical channels. Inner cells may be formed on the inner vertical channels along the first direction, and outer cells may be formed on the outer vertical channels along the first direction. The common source line of the doping region DOP in FIG. 5 is disposed in the word line cut region WDCT.

Referring to FIG. 7, the vertical channels may be arranged in a zig-zag manner in the memory cell array. Through the zig-zag manner, the area of the memory cell array may be reduced. One outer channel hole and one inner channel hole are disposed in a column direction D3 between the two adjacent word line cut regions WDCT in the memory cell array. For convenience of illustration, only one bit line pair BLi and BLo are illustrated and the other bit lines are omitted in FIG. 7. For example, the inner bit line BLi may be an even-numbered bit line and the outer bit line BLo may be an odd-numbered bit line. In an exemplary embodiment, the inner bit line BLi may be an odd-numbered bit line and the outer bit line BLo may be an even-numbered bit line.

As illustrated in FIG. 7, the outer cells may be formed along the outer vertical channels (and the inner cells may be formed along the inner vertical channels where a distance Do between the outer vertical channel and the word line cut region WDCT is smaller than a distance Di between the inner vertical channel hole and the word line cut region WDCT. In this case, the distances of the cells may be measured from a closer word line cut region among the two adjacent word line cut region WDCT.

Referring to FIG. 8, the inner NAND string NSi is formed in the inner vertical channel and the outer NAND string NSo is formed in the outer vertical channel. One end of the inner NAND string NSi is connected to the inner bit line BLi and the other end of the inner NAND string NSi is connected to the common source line CSL through an inner resistor Ri. One end of the outer NAND string NSo is connected to the outer bit line BLo and the other end of the outer NAND string NSo is connected to the common source line CSL through an outer resistor Ro.

As the distance Do between the outer channel hole and the word line cut region WDCT is smaller than a distance Di between the inner channel hole and the word line cut region WDCT as illustrated in FIG. 7, the resistance value of the inner resistor Ri is greater than the resistance value of the outer resistor Ro.

As such, the inner NAND string NSi and the outer NAND string NSo may be connected to the common source line CSL through the resistors Ri and Ro of the different resistance values. The inner cells in the inner NAND string NSi and the outer cells in the outer NAND string NSo may have different electrical characteristics due to the asymmetric connection structure of the inner NAND string NSi and the outer NAND string NSo. Such different electrical characteristics may result in the difference in the error bit levels.

The memory device and the method of controlling the ECC operation in the memory device may decrease the maximum error bit level of the ECC sector by uniformalizing the error bit levels according to cell characteristics. Through decrease of the maximum error bit level, repair rate of the bad memory devices may be increased and thus yield, performance and lifetime of the memory devices may be increased.

Figure 9:
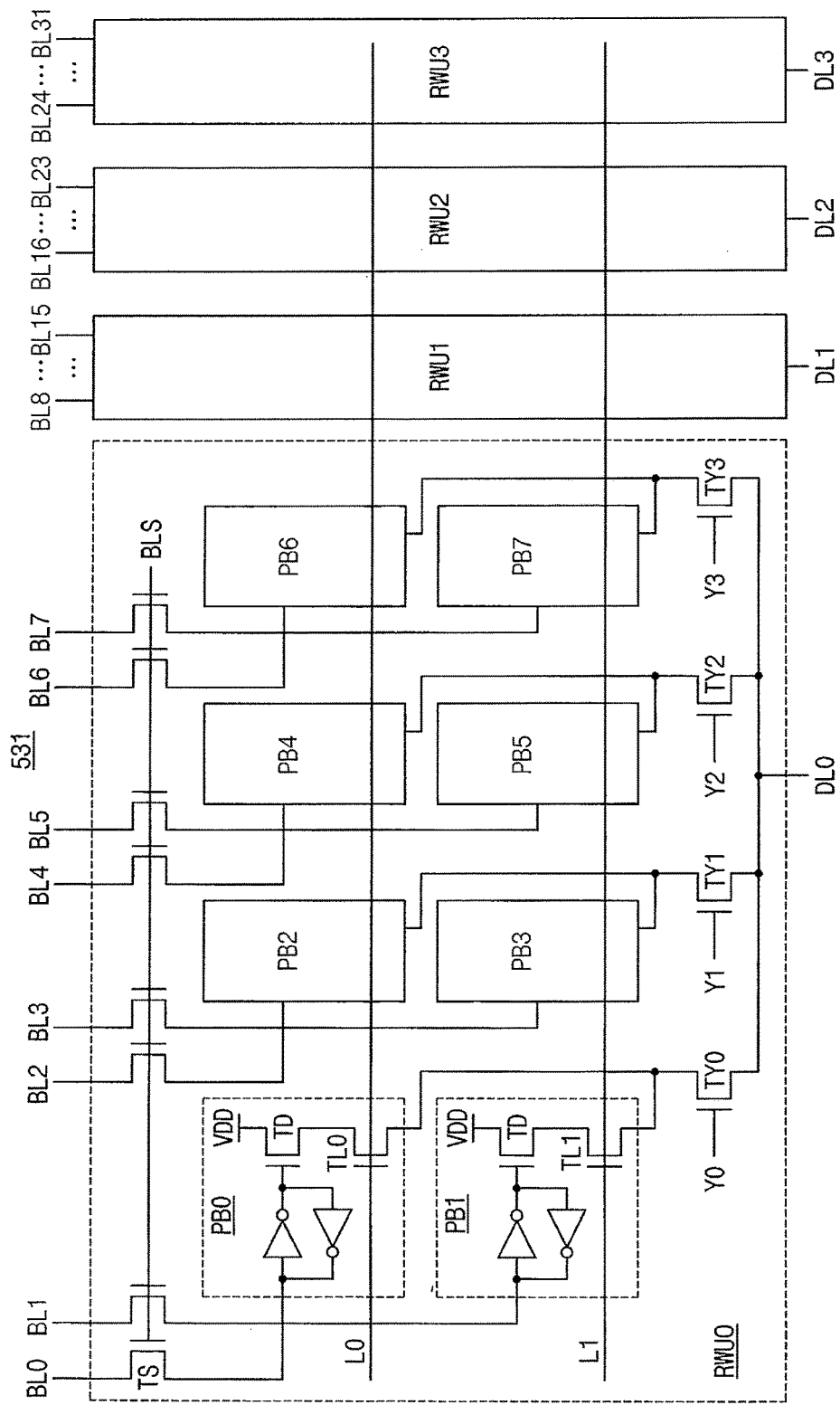
FIG. 9 is a diagram illustrating a read-write circuit included in the memory device of FIG. 4 according to an exemplary embodiment.

FIG. 9 is a diagram illustrating a read-write circuit included in the memory device of FIG. 4 according to an exemplary embodiment.

For convenience of illustration and description, only example configuration for reading data from the memory cell array is illustrated in FIG. 9 and configuration for write data in the memory cell array is omitted.

Referring to FIG. 9, a read-write circuit 531 may include a first read-write unit RWU0, a second read-write unit RWU1 a third read-write unit RWU2 and a fourth read-write unit RWU3. The first read-write unit RWU0 may be connected to first through eighth bit lines BL0~BL7 and a first data line DL0. The second read-write unit RWU1 may be connected to ninth through sixteenth bit lines BL8~BL15 and a second data line DL1. The third read-write unit RWU2 may be connected to seventeenth through twenty fourth bit lines BL16~BL23 and a third data line DL2. The fourth read-write unit RWU3 may be connected to twenty fifth through thirty second bit lines BL24~BL31 and a fourth data line DL3.

Hereinafter, an exemplary embodiment are described based on a configuration that the thirty two bit lines BL0~BL31 are grouped into four bit line groups BGR1~BGR4 and each bit line group includes eight bit lines. The four bit line groups BGR1~BGR4 are connected to the four read-write unit RWU0~RWU3, respectively. The number of the bit line groups or the read-write units and the number of bit lines in each bit line group are not limited thereto but may be changed variously.

The first read-write unit RWU0 may include a plurality of page buffers PB0~PB7. FIG. 9 illustrates the page buffers PB0~PB7 arranged in a matrix form of two rows and four columns, but the numbers of the rows and the columns may be changed variously.

Each of the page buffers PB0~PB7 may include a latch of two inverters, a driving transistor TD and a latch transistor TL.

One end of the latch in the first page buffer PB0 may be connected to the first bit line BL0 through a switching transistor TS that is turned on in response to a bit line selection signal BLS, and the other end of the latch in the first page buffer PB0 may be connected to a gate of the driving transistor TD. The driving transistor TD is connected to a first column selection transistor TY0 through the first latch transistor TL0 that is turned on in response to a first latch signal L0.

In the same way, the third page buffer PB2, the fifth page buffer PB4 and the seventh page buffer PB6 may be connected between the third bit line BL2 and the second column selection transistor TY1, the fifth bit line BL4 and the third column selection transistor TY2, and the seventh bit line BL6 and the fourth column selection transistor TY3, respectively.

One end of the latch in the second page buffer PB1 may be connected to the second bit line BL1 through the switching transistor TS that is turned on in response to the bit line selection signal BLS, and the other end of the latch in the second page buffer PB1 may be connected to the gate of the driving transistor TD. The driving transistor TD is connected to the first column selection transistor TY0 through the second latch transistor TL1 that is turned on in response to a second latch signal L1.

In the same way, the fourth page buffer PB3, the sixth page buffer PB5 and the eighth page buffer PB7 may be connected between the fourth bit line BL3 and the second column selection transistor TY1, the sixth bit line BL5 and the third column selection transistor TY2, and the eighth bit line BL7 and the fourth column selection transistor TY3, respectively.

The first page buffer PB0 and the second page buffer PB1 are connected to the first data line DL0 through the first column selection transistor TY0 that is turned on in response to a first column selection signal Y0. The third page buffer PB2 and the fourth page buffer PB3 are connected to the first data line DL0 through the second column selection transistor TY1 that is turned on in response to a second column selection signal Y1. The fifth page buffer PB4 and the sixth page buffer PB5 are connected to the first data line DL0 through the third column selection transistor TY2 that is turned on in response to a third column selection signal Y2. The seventh page buffer PB6 and the eighth page buffer PB7 are connected to the first data line DL0 through the fourth column selection transistor TY3 that is turned on in response to a fourth column selection signal Y3.

One of the first latch signal L0 and the second latch signal L1 is turned on selectively at one time. When the first latch signal L0 is activated, the even-numbered page buffers PB0, PB2, PB4 and PB6 in the first row may be electrically connected to the column selection transistors TY0, TY1, TY2 and TY3, respectively. When the second latch signal L1 is activated, the odd-numbered page buffers PB1, PB3, PB5 and PB7 in the second row may be electrically connected to the column selection transistors TY0, TY1, TY2 and TY3, respectively.

One of the first through fourth column selection signal Y0~Y3 is activated selectively at one time. When the first column selection signal Y0 is activated, the page buffers PB0 and PB1 in the first column are electrically connected to the first data line DL0. When the second column selection signal Y1 is activated, the page buffers PB2 and PB3 in the second column are electrically connected to the first data line DL0. When the third column selection signal Y2 is activated, the page buffers PB4 and PB5 in the third column are electrically connected to the first data line DL0. When the fourth column selection signal Y3 is activated, the page buffers PB6 and PB7 in the fourth column are electrically connected to the first data line DL0.

As a result, the first read-write unit RWU0 may electrically connect the first data line DL0 to one of the first through eighth bit lines BL0~BL7 in response to the latch signals L0 and L1 and the column selection signals Y0, Y1, Y2 and Y3.

The second read-write unit RWU1, the third read-write unit RWU2 and the fourth read-write unit RWU3 may have substantially the same configuration as the first read-write unit RWU0. The second read-write unit RWU1 may electrically connect the second data line DL1 to one of the ninth through sixteenth bit lines BL8~BL15 in response to the latch signals L0 and L1 and the column selection signals Y0, Y1, Y2 and Y3. The third read-write unit RWU2 may electrically connect the third data line DL2 to one of the seventeenth through twenty fourth bit lines BL16~BL23 in response to the latch signals L0 and L1 and the column selection signals Y0, Y1, Y2 and Y3. The fourth read-write unit RWU3 may electrically connect the fourth data line DL3 to one of the twenty fifth through thirty second bit lines BL24~BL31 in response to the latch signals L0 and L1 and the column selection signals Y0, Y1, Y2 and Y3.

FIG. 10 is a diagram illustrating decoded address signals provided to the read-write circuit of FIG. 9 according to an exemplary embodiment.

The address decoder 520 in FIG. 4 may generate decoded address signals L0, L1, Y0, Y1, Y2 and Y3 based on first, second and third address bits A0, A1 and A2 that are included in the address ADDR. The decoded address signals L0, L1, Y0, Y1, Y2 and Y3 may include the latch signals L0 and L1 and the column selection signals Y0~Y3 as described with reference to FIG. 9.

Referring to FIG. 10, the latch signals L0 and L1 may be generated based on the third address bit A2, and the column selection signals Y0~Y3 may be generated based on the first and second address bits A0 and A1.

When the third address bit A2 is "0", the first latch signal L0 may be in the logic high level H and the second latch signal L1 may be in the logic low level L. If the third address bit A2 is "1", the first latch signal L0 may be in the logic low level L and the second latch signal L1 may be in the logic high level H.

When the value "A1A0" of the second address bit A1 and the first address bit A0 is "00", the first column selection signal Y0 is in the logic high level H and the other column selection signals Y1, Y2 and Y3 are in the logic low level L. When the value "A1A0" of the second address bit A1 and the first address bit A0 is "01", the second column selection signal Y1 is in the logic high level H and the other column selection signals Y0, Y2 and Y3 are in the logic low level L. When the value "A1A0" of the second address bit A1 and the first address bit A0 is "10", the third column selection signal Y2 is in the logic high level H and the other column selection signals Y0, Y1 and Y3 are in the logic low level L. When the value "A1A0" of the second address bit A1 and the first address bit A0 is "11", the fourth column selection signal Y3 is in the logic high level H and the other column selection signals Y0, Y1 and Y2 are in the logic low level L.

When the value "A2A1A0" of the address bits A0, A1 and A2 is "000", the read-write circuit 531 of FIG. 9 may connect the first bit line BL0, the ninth bit line BL8, the seventeenth bit line BL16 and the twenty fifth bit line BL24 to the first through fourth data lines DL0~DL3, respectively. When the value "A2A1A0" of the address bits A0, A1 and A2 is increased by one to be "001", the read-write circuit 531 may connect the third bit line BL2, the eleventh bit line BL10, the nineteenth bit line BL18 and the twenty seventh bit line BL26 to the first through fourth data lines DL0~DL3, respectively.

As such, the data input-output order ORDB of the bit lines is illustrated in FIGS. 11 through 20 for a case that the value "A2A1A0" of the address bits A0, A1 and A2 is increased from "000" to "111".

Figure 11:
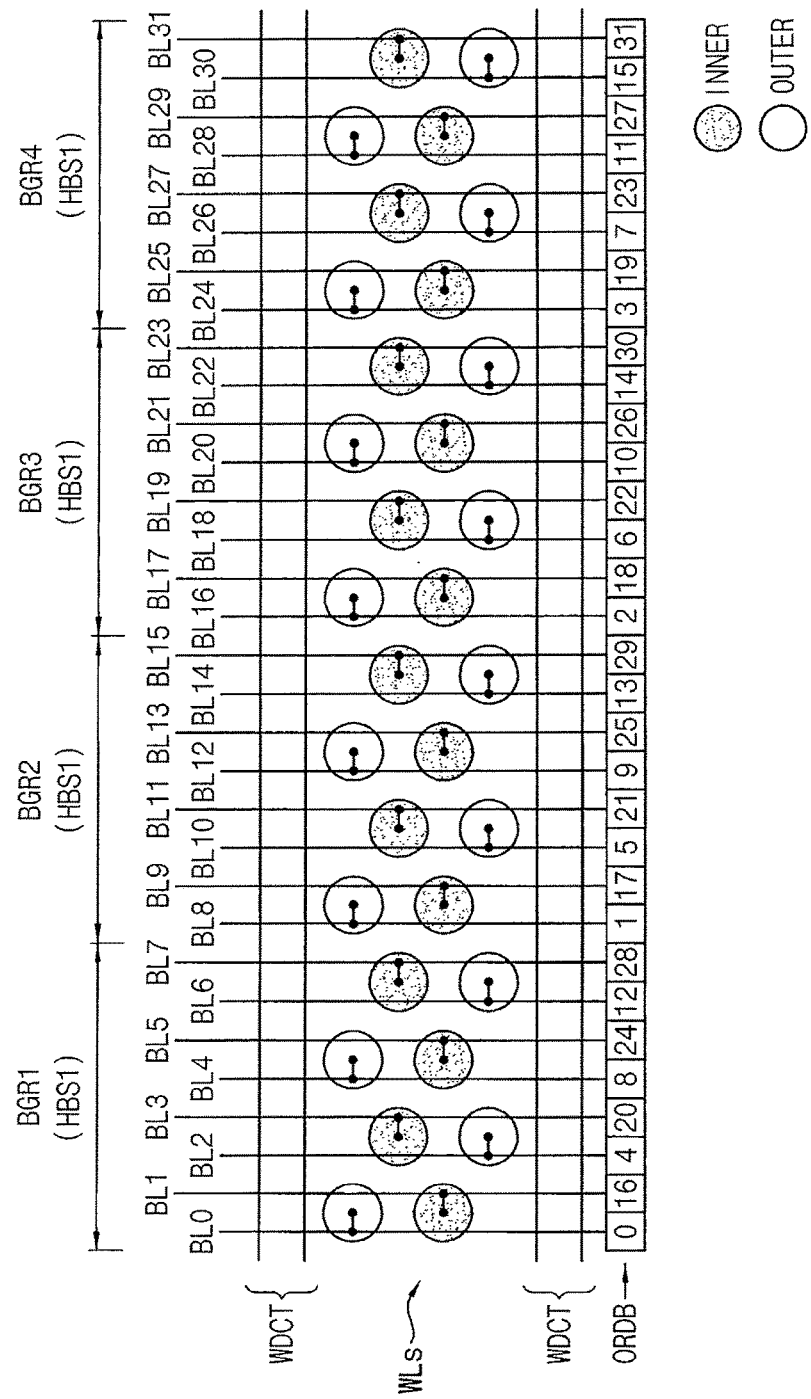
FIG. 11 is a diagram illustrating a connection structure between memory cells and bit lines according to an exemplary embodiment.
Figure 12:
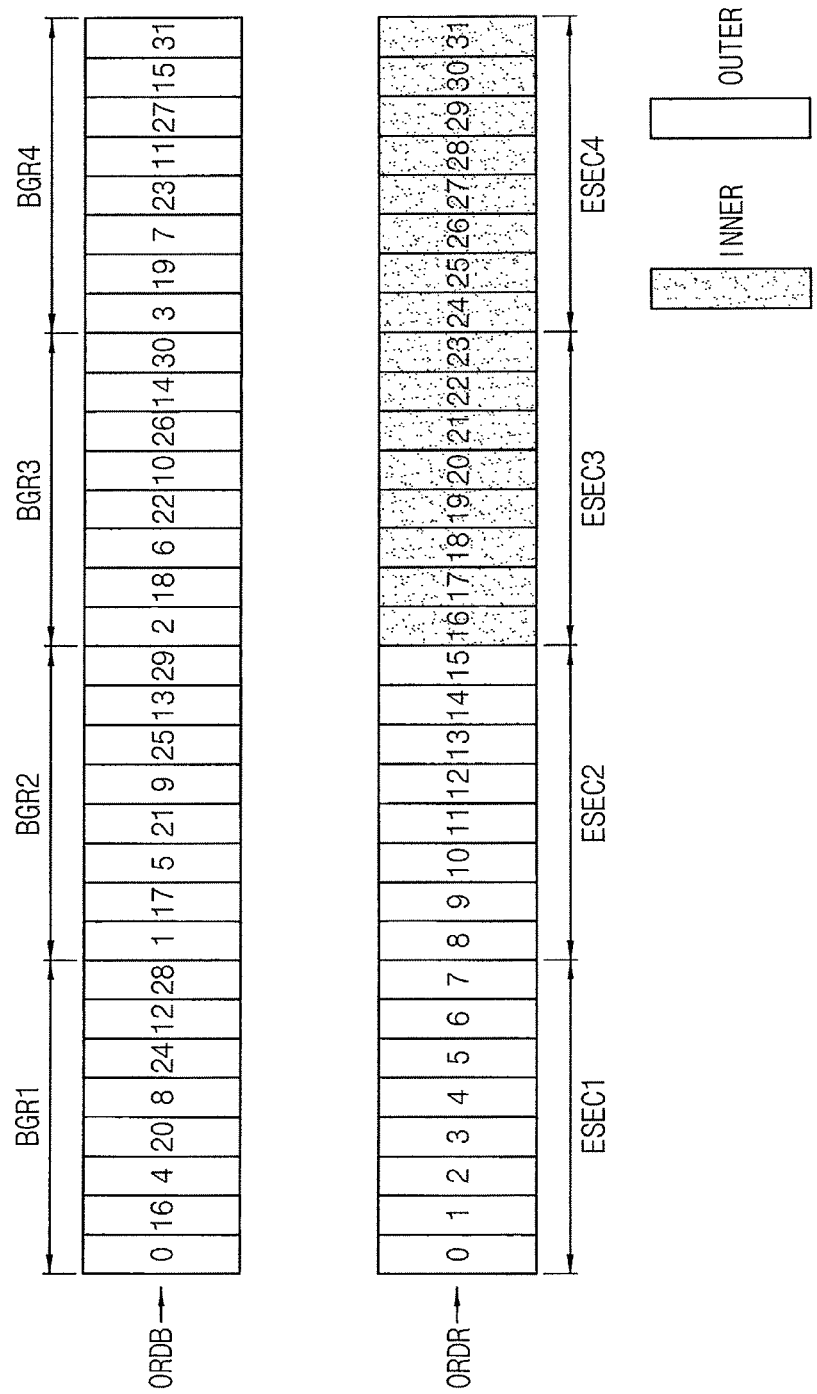
FIG. 12 is a diagram illustrating a data input-output order according to the connection structure of FIG. 11.

FIG. 11 is a diagram illustrating a connection structure between memory cells and bit lines according to an exemplary embodiment, and FIG. 12 is a diagram illustrating a data input-output order according to the connection structure of FIG. 11.

As illustrated in FIG. 11, a first bit line group BGR1 may include first through eighth bit lines BL0~BL7 adjacent to each other, a second bit line group BGR2 may include ninth through sixteenth bit lines BL8~BL18 adjacent to each other, a third bit line group BGR3 may include seventeenth through twenty fourth bit lines BL16~BL23 adjacent to each other and a fourth bit line group BGR4 may include twenty fifth through thirty second bit lines BL24~BL31 adjacent to each other.

Hereinafter, a first connection scheme is defined such that, with respect to each bit line pair, an even-numbered bit line is connected to an outer cell and an odd-number bit line is connected to an inner cell, and a second connection scheme is defined such that, with respect to each bit line pair, an even-numbered bit line is connected to an inner cell and an odd-number bit line is connected to an outer cell.

Referring to FIG. 11, each of the first through fourth bit line group BGR1~BGR4 may have a first connection structure HBS1 such that the first connection scheme is applied to all of the bit line pairs in each bit line group. In the bottom portion of FIG. 11, the data input-output order ORDB is illustrated for the case that the read-write circuit 531 of FIG. 9 and the address decoding of FIG. 10 are applied and the value "A2A1A0" of the address bits A0, A1 and A2 is increased from "000" to "111".

FIG. 12 illustrates a data input-output order ORDB of the bit lines according to the connection structure of FIG. 11 and an arranged order ORDR of the inner cells and the outer cells. When the size of the ECC sector is 8 bits, the first ECC sector ESEC1 and the second ECC sector ESEC2 include only the outer cells, and the third ECC sector ESEC3 and the fourth ECC sector ESEC4 includes only the inner cells.

As described with reference to FIGS. 1 and 2, when only the memory cells of the same characteristic are concentrated in each logical ECC sector, the maximum error bit level or the maximum number of the error bits in each ECC sector is determined by the worse characteristic. According to an exemplary embodiment, the data input-output order of the memory cells may be arranged so that the memory cells of the worse characteristic need not be concentrated in the same ECC sector, thereby decreasing the maximum error bit level. In other words, the memory cells of the worse characteristic may be uniformly distributed among ECC sectors to reduce the maximum error bit level.

In an exemplary embodiment, as described with reference to FIGS. 13 through 20, a connection structure between the memory cells and bit lines may be determined such that the memory cells of the respective cell groups may be included uniformly in each of the ECC sectors.

In some an exemplary embodiment, as described with reference to FIGS. 21 through 24, a connection structure between bit lines and a read-write circuit may be determined such that the memory cells of the respective cell groups may be included uniformly in each of the ECC sectors.

In an exemplary embodiment, as described with reference to FIGS. 25 through 27, a connection structure between decoded address signals and a read-write circuit may be determined such that the memory cells of the respective cell groups may be included uniformly in each of the ECC sectors.

In an exemplary embodiment, as described with reference to FIGS. 28 through 32, an address that is input to an address decoder may be changed such that the memory cells of the respective cell groups may be included uniformly in each of the ECC sectors.

Figure 13:
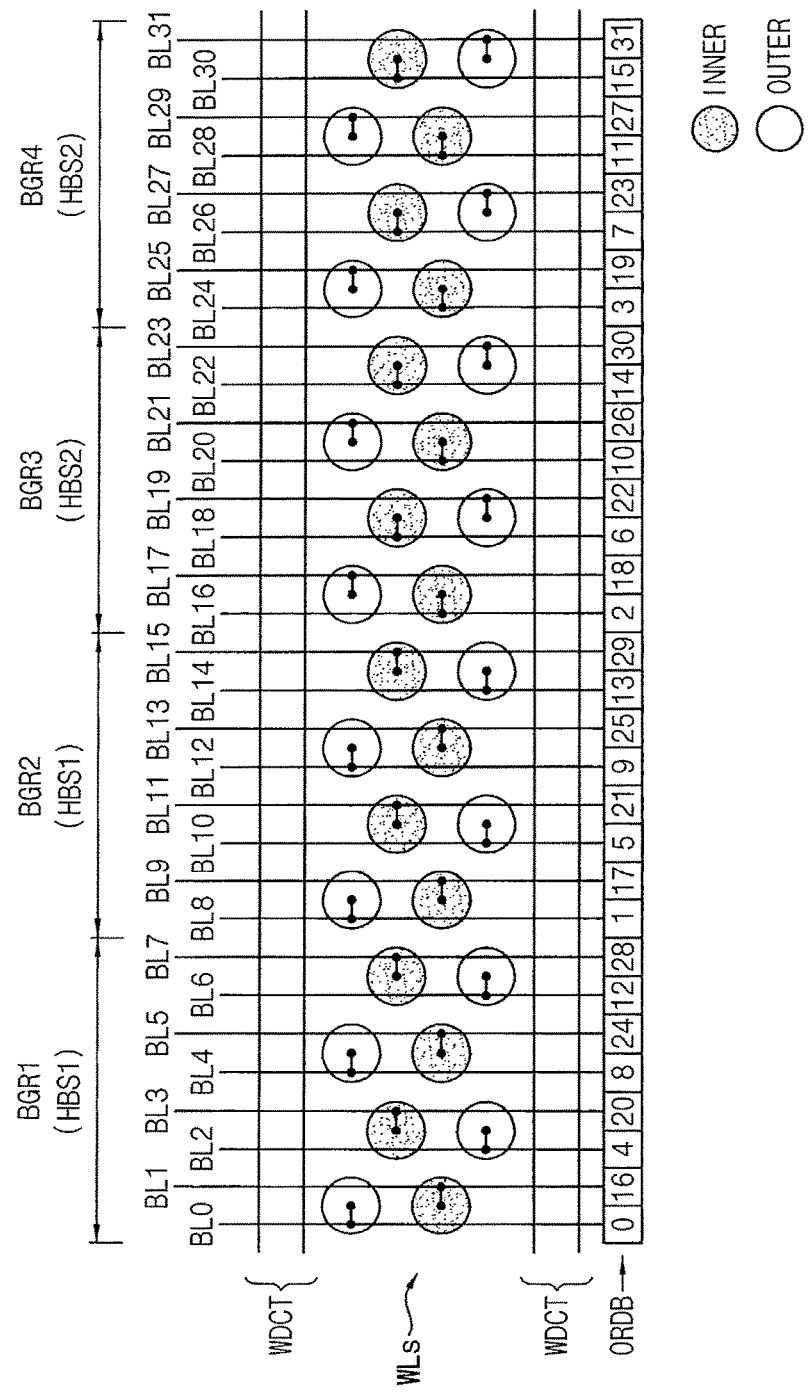
FIG. 13 is a diagram illustrating a connection structure between memory cells and bit lines according to an exemplary embodiment.
Figure 14:
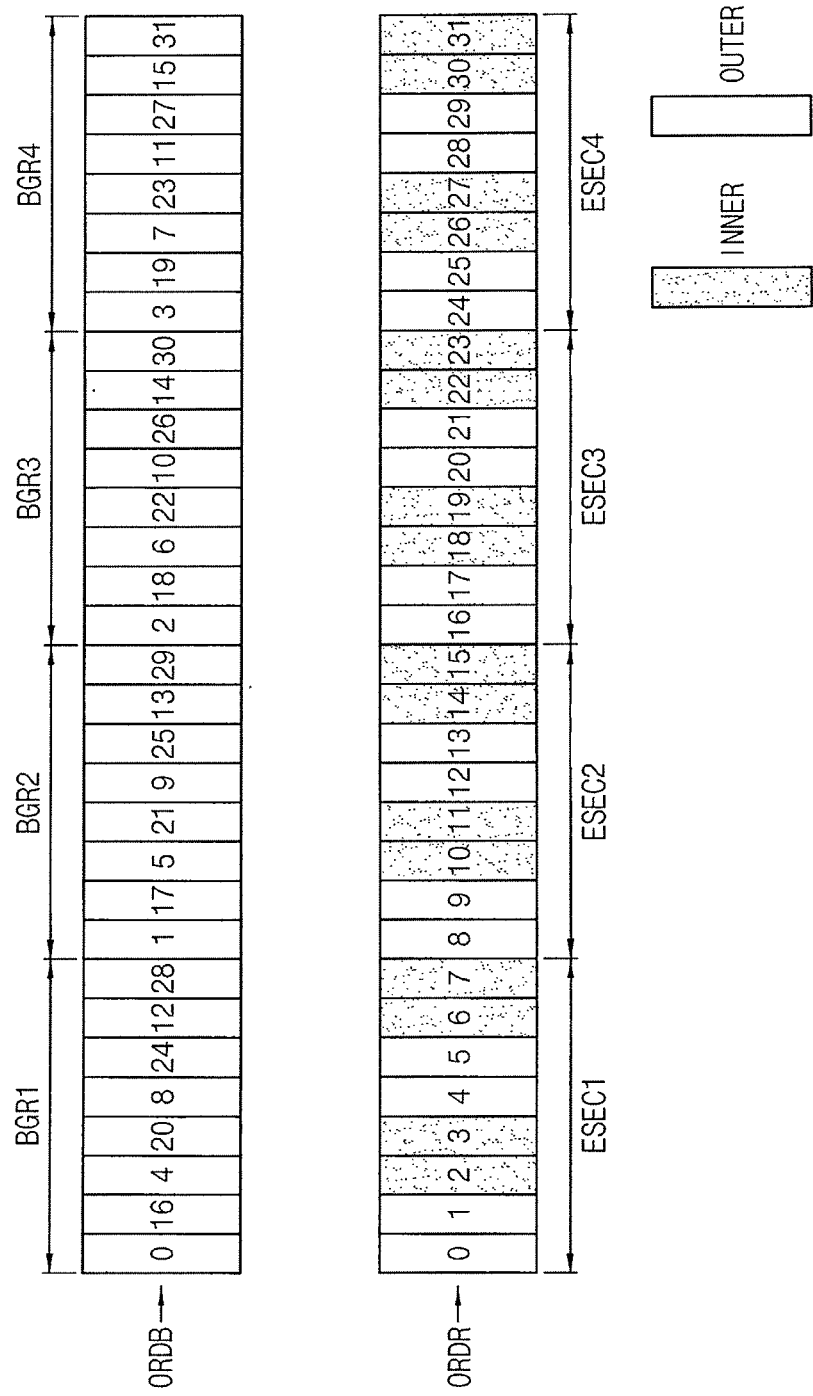
FIG. 14 is a diagram illustrating a data input-output order according to the connection structure of FIG. 13.

FIG. 13 is a diagram illustrating a connection structure between memory cells and bit lines according to an exemplary embodiment, and FIG. 14 is a diagram illustrating a data input-output order according to the connection structure of FIG. 13.

Referring to FIG. 13, each of the first and second bit line group BGR1 and BGR2 may have a first connection structure HBS1 such that the first connection scheme is applied to all of the bit line pairs in each bit line group, and each of the third and fourth bit line group BGR3 and BGR4 may have a second connection structure HBS2 such that the second connection scheme is applied to all of the bit line pairs in each bit line group. In the bottom portion of FIG. 13, the data input-output order ORDB is illustrated for the case that the read-write circuit 531 of FIG. 9 and the address decoding of FIG. 10 are applied and the value "A2A1A0" of the address bits A0, A1 and A2 is increased from "000" to "111".

FIG. 14 illustrates a data input-output order ORDB of the bit lines according to the connection structure of FIG. 13 and an arranged order ORDR of the inner cells and the outer cells. When the size of the ECC sector is 8 bits, each of the first through fourth ECC sectors ESEC1~ESEC4 includes the same number of the outer cells and the inner cells because the two outer cells and the two inner cells are interleaved and arranged alternatively.

Figure 15:
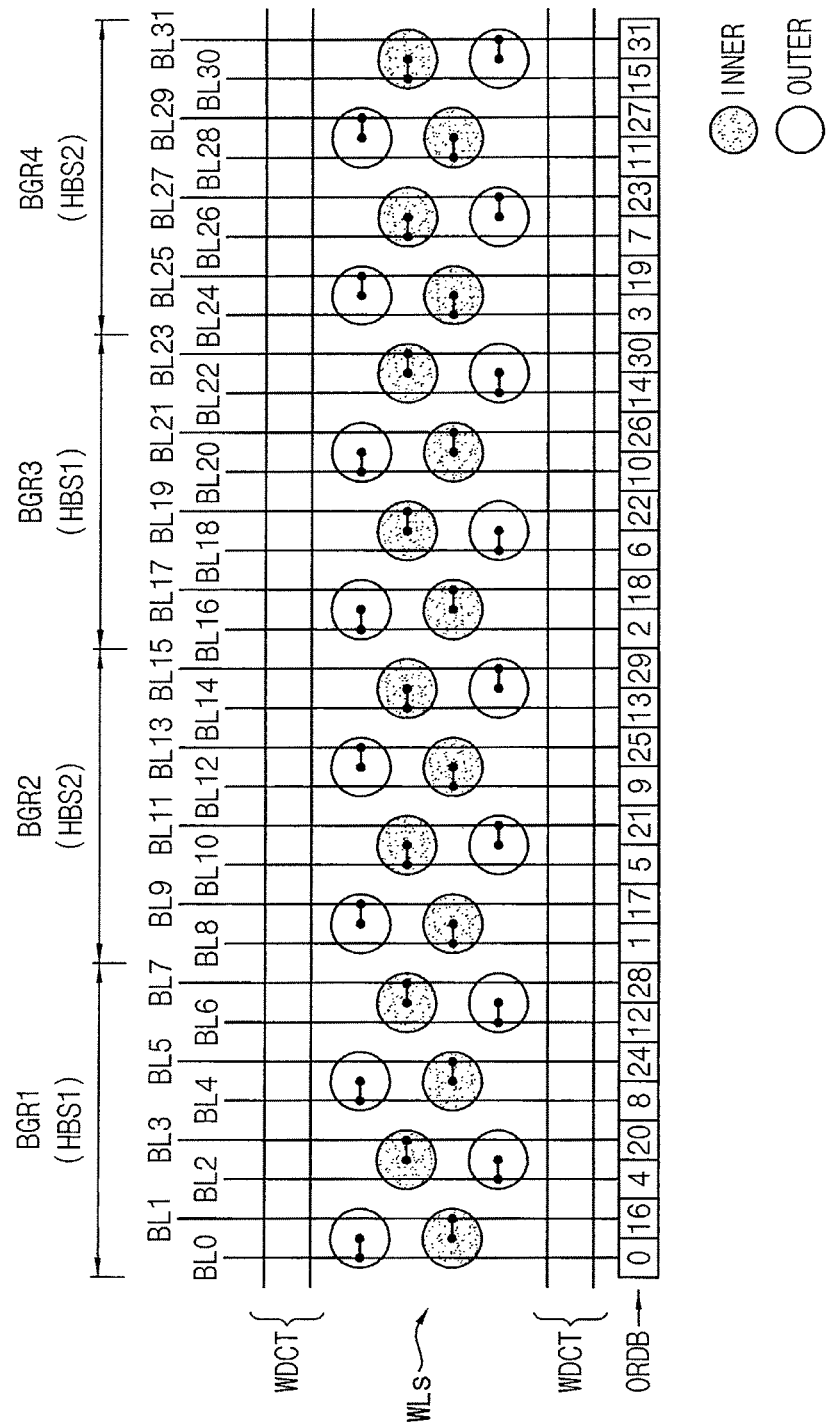
FIG. 15 is a diagram illustrating a connection structure between memory cells and bit lines according to an exemplary embodiment.
Figure 16:
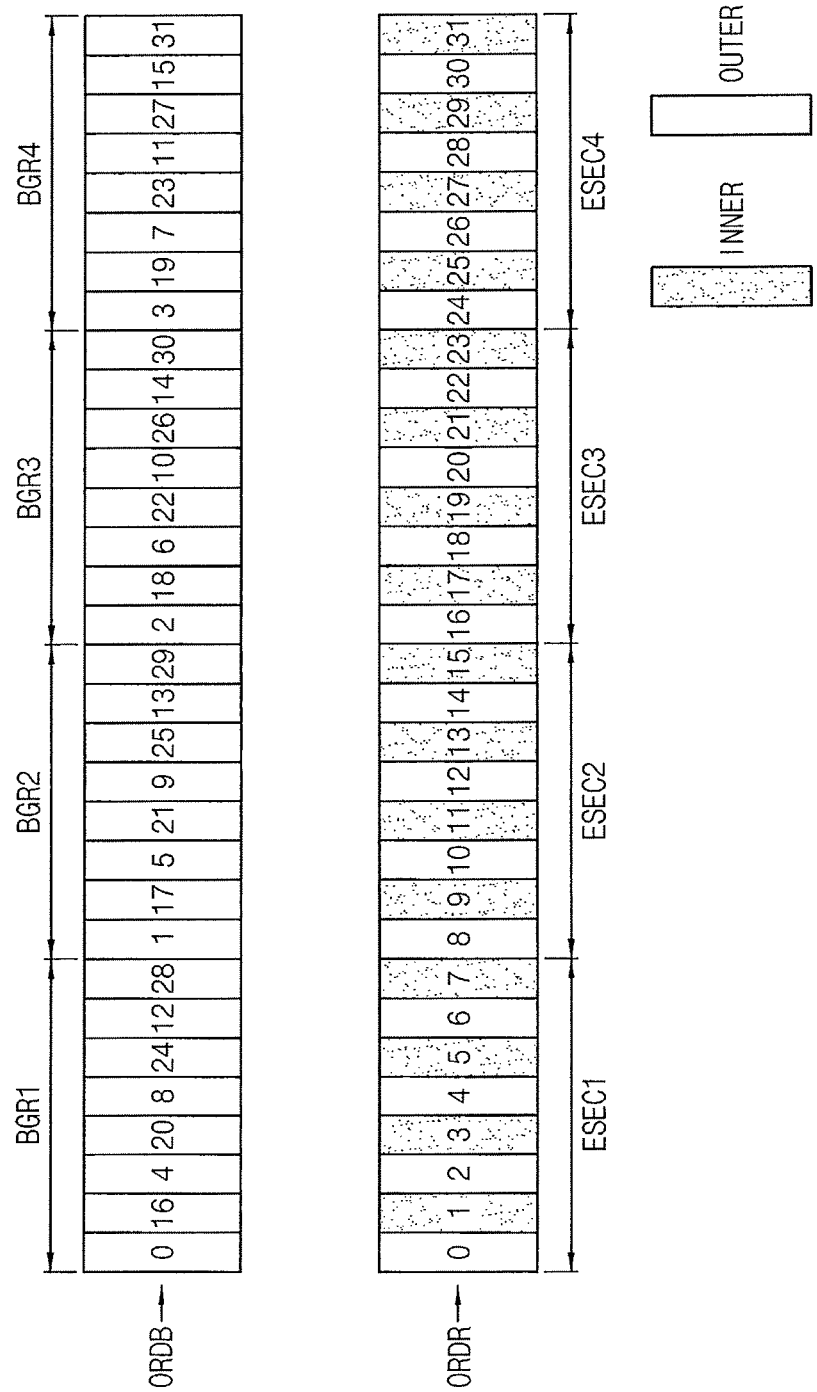
FIG. 16 is a diagram illustrating a data input-output order according to the connection structure of FIG. 15.

FIG. 15 is a diagram illustrating a connection structure between memory cells and bit lines according to an example embodiment, and FIG. 16 is a diagram illustrating a data input-output order according to the connection structure of FIG. 15.

Referring to FIG. 15, each of the first and third bit line groups BGR1 and BGR3 may have a first connection structure HBS1 such that the first connection scheme is applied to all of the bit line pairs in each bit line group, and each of the second and fourth bit line groups BGR2 and BGR4 may have a second connection structure HBS2 such that the second connection scheme is applied to all of the bit line pairs in each bit line group. In the bottom portion of FIG. 15, the data input-output order ORDB is illustrated for the case that the read-write circuit 531 of FIG. 9 and the address decoding of FIG. 10 are applied and the value "A2A1A0" of the address bits A0, A1 and A2 is increased from "000" to "111".

FIG. 16 illustrates a data input-output order ORDB of the bit lines according to the connection structure of FIG. 15 and an arranged order ORDR of the inner cells and the outer cells. When the size of the ECC sector is 8 bits, each of the first through fourth ECC sectors ESEC1~ESEC4 includes the same number of the outer cells and the inner cells because the one outer cell and the one inner cell are interleaved and arranged alternatively.

Figure 17:
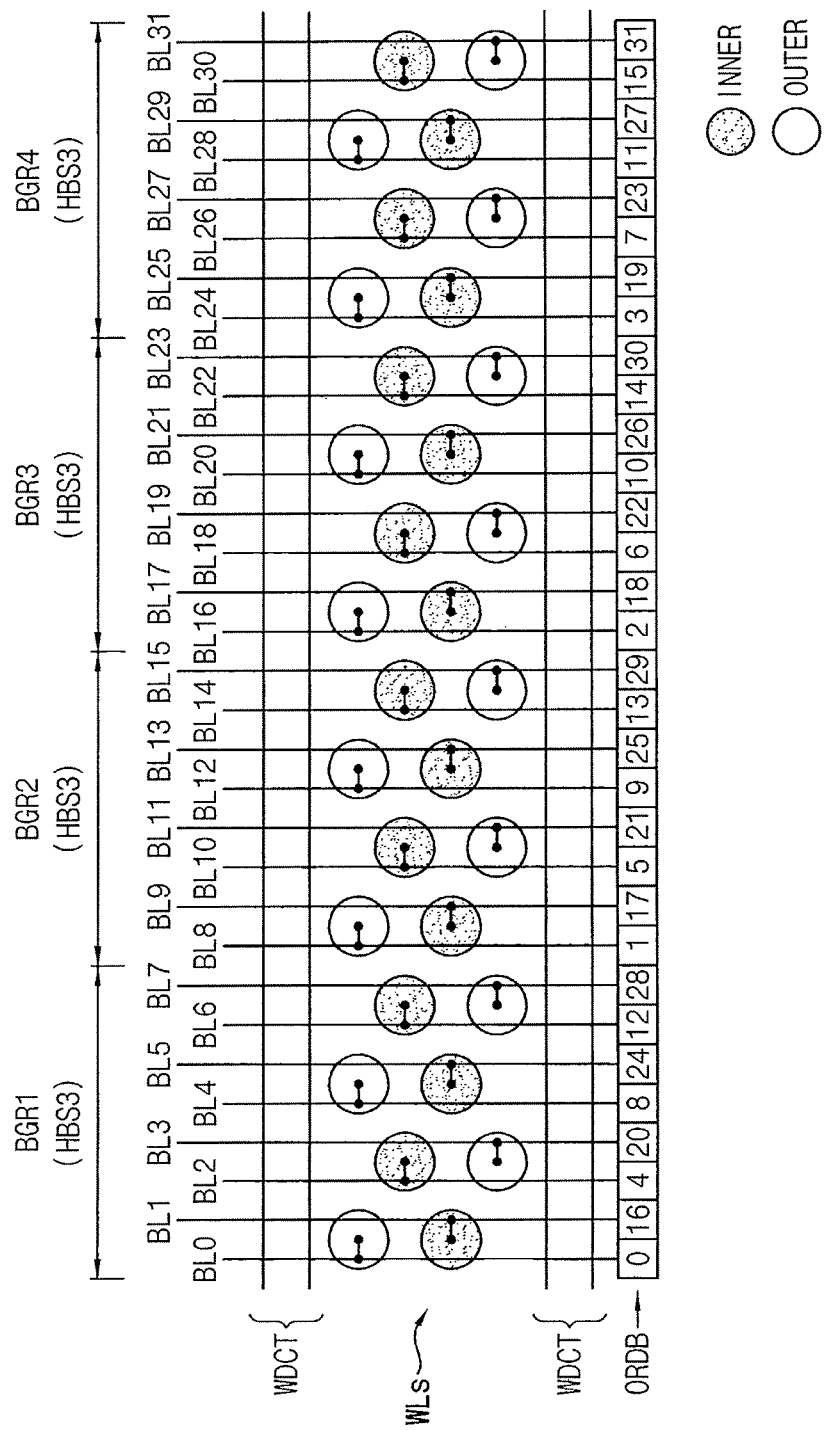
FIG. 17 is a diagram illustrating a connection structure between memory cells and bit lines according to an exemplary embodiment.
Figure 18:
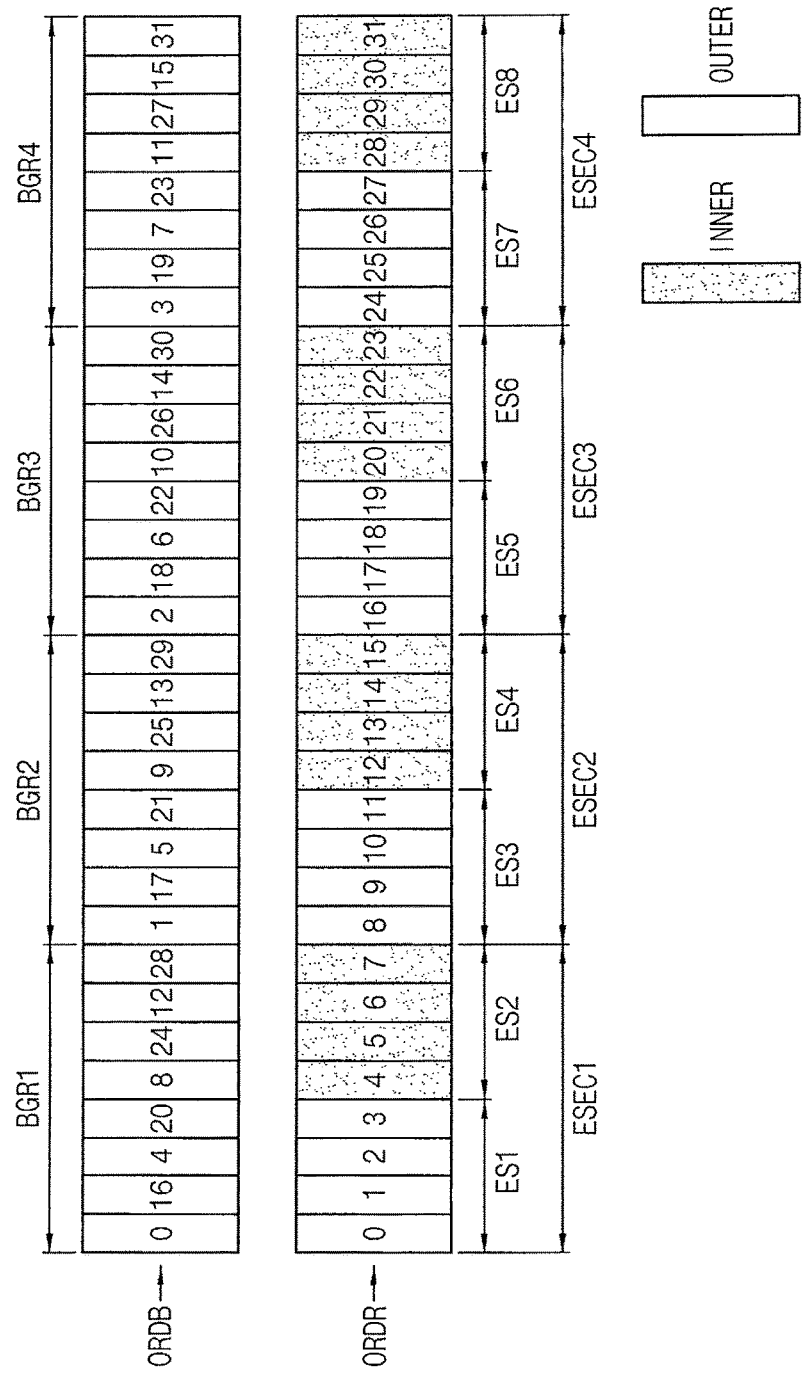
FIG. 18 is a diagram illustrating a data input-output order according to the connection structure of FIG. 17.

FIG. 17 is a diagram illustrating a connection structure between memory cells and bit lines according to an example embodiment, and FIG. 18 is a diagram illustrating a data input-output order according to the connection structure of FIG. 17.

Referring to FIG. 17, each of the first through fourth bit line groups BGR1~BGR4 may have a third connection structure HBS3 such that the first connection scheme and the second connection scheme are mixed and applied uniformly to the bit line pairs in each bit line group. In the bottom portion of FIG. 17, the data input-output order ORDB is illustrated for the case that the read-write circuit 531 of FIG. 9 and the address decoding of FIG. 10 are applied and the value "A2A1A0" of the address bits A0, A1 and A2 is increased from "000" to "111".

FIG. 18 illustrates a data input-output order ORDB of the bit lines according to the connection structure of FIG. 17 and an arranged order ORDR of the inner cells and the outer cells. When the size of the ECC sector is 8 bits, each of the first through fourth ECC sectors ESEC1~ESEC4 includes the same number of the outer cells and the inner cells because the four outer cells and the four inner cells are interleaved and arranged alternatively.

However, when the size of the ECC sector is 4 bits, first, third, fifth and seventh ECC sectors ES1, ES3, ES5 and ES7 include only the outer cells, and second, fourth, sixth and eighth ECC sectors ES2, ES4, ES6 and ES8 include only the inner cells. In this case, as will be described below with reference to FIGS. 19 and 20, an applying order of the first connection scheme and the second connection scheme may be opposite between some bit line groups and the other bit line groups, to uniformalize the number of the outer cells and the inner cells in each of the ECC sectors ES1~ES8.

Figure 19:
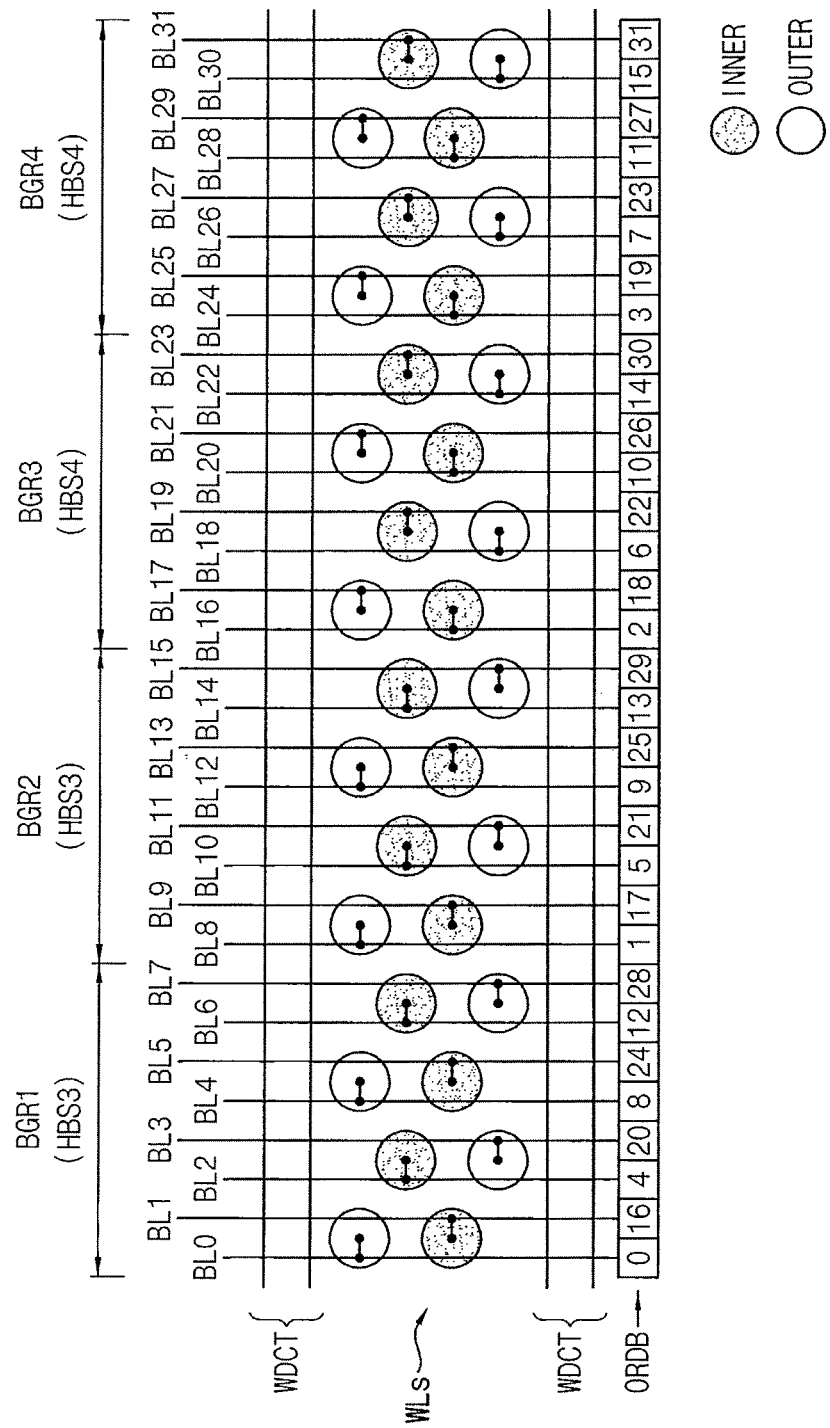
FIG. 19 is a diagram illustrating a connection structure between memory cells and bit lines according to an exemplary embodiment.
Figure 20:
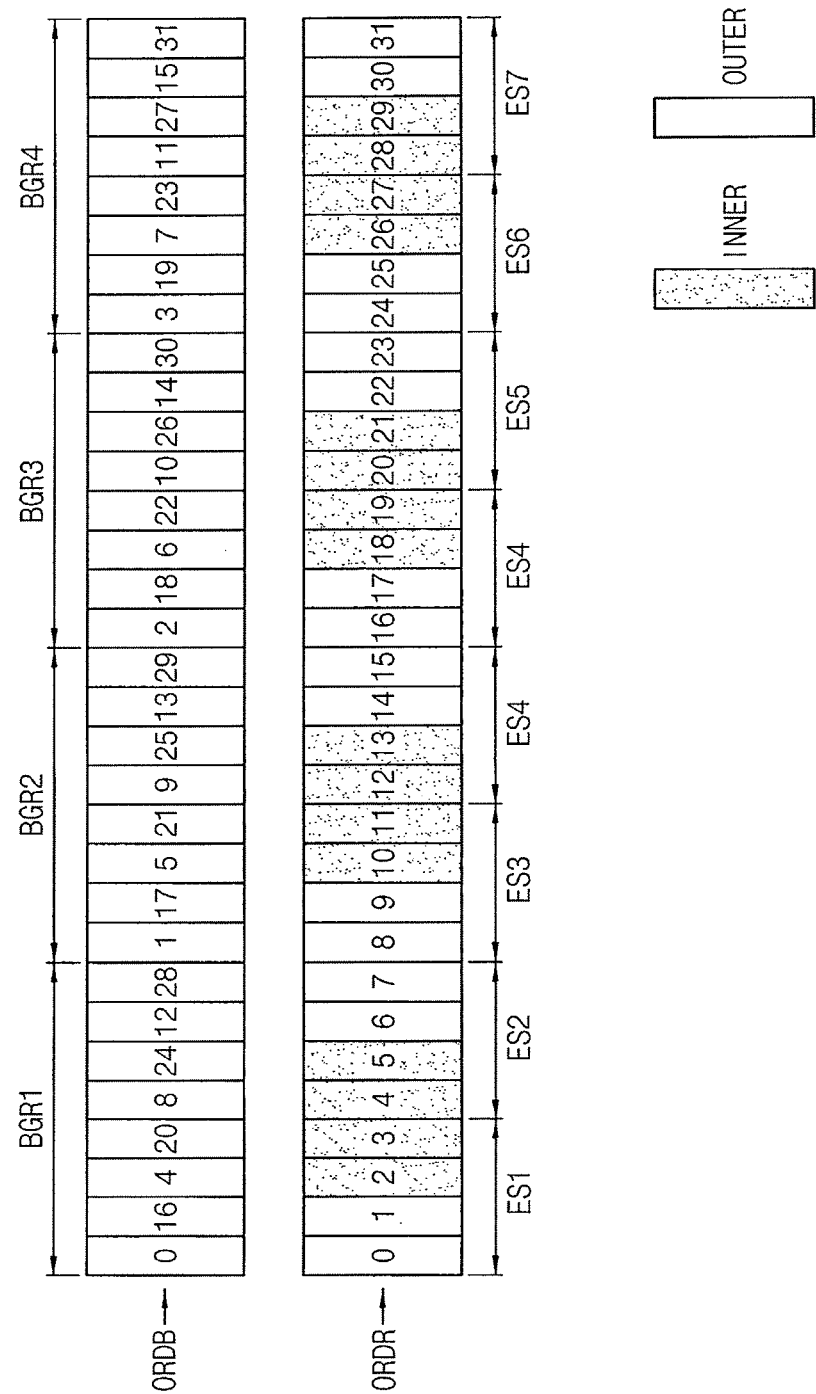
FIG. 20 is a diagram illustrating a data input-output order according to the connection structure of FIG. 19.

FIG. 19 is a diagram illustrating a connection structure between memory cells and bit lines according to an example embodiment, and FIG. 20 is a diagram illustrating a data input-output order according to the connection structure of FIG. 19.

Referring to FIG. 19, each of the first and second bit line groups BGR1 and BGR2 may have a third connection structure HBS3 such that the first connection scheme, the second connection scheme, the first connection scheme and the second connection scheme are applied to the four bit line pairs in that order. In contrast, each of the third and fourth bit line groups BGR3 and BGR4 may have a fourth connection structure HBS4 such that the second connection scheme, the first connection scheme, the second connection scheme and the first connection scheme are applied to the four bit line pairs in that order. For example, the applying order of the first connection scheme and the second connection scheme is opposite between the first and second bit line groups BGR1 and BGR2 and the third and fourth bit line groups BGR3 and BGR4.

FIG. 20 illustrates a data input-output order ORDB of the bit lines according to the connection structure of FIG. 19 and an arranged order ORDR of the inner cells and the outer cells. Even though the size of the ECC sector is 4 bits, each of the first through eighth ECC sectors ES1~ES8 includes the two outer cells and the two inner cells.

As described with reference to FIGS. 13 through 20, the connection structure between the memory cells and bit lines may be determined such that the same number of the outer cells and the inner cells are included in each of the ECC sectors. Through the uniformalization of the error bit levels according to cell characteristics, the maximum error bit level of the entire ECC sectors may be decreased.

FIGS. 21 through 24 are diagrams illustrating connection structures between bit lines and page buffers according to an exemplary embodiment.

Figure 21:
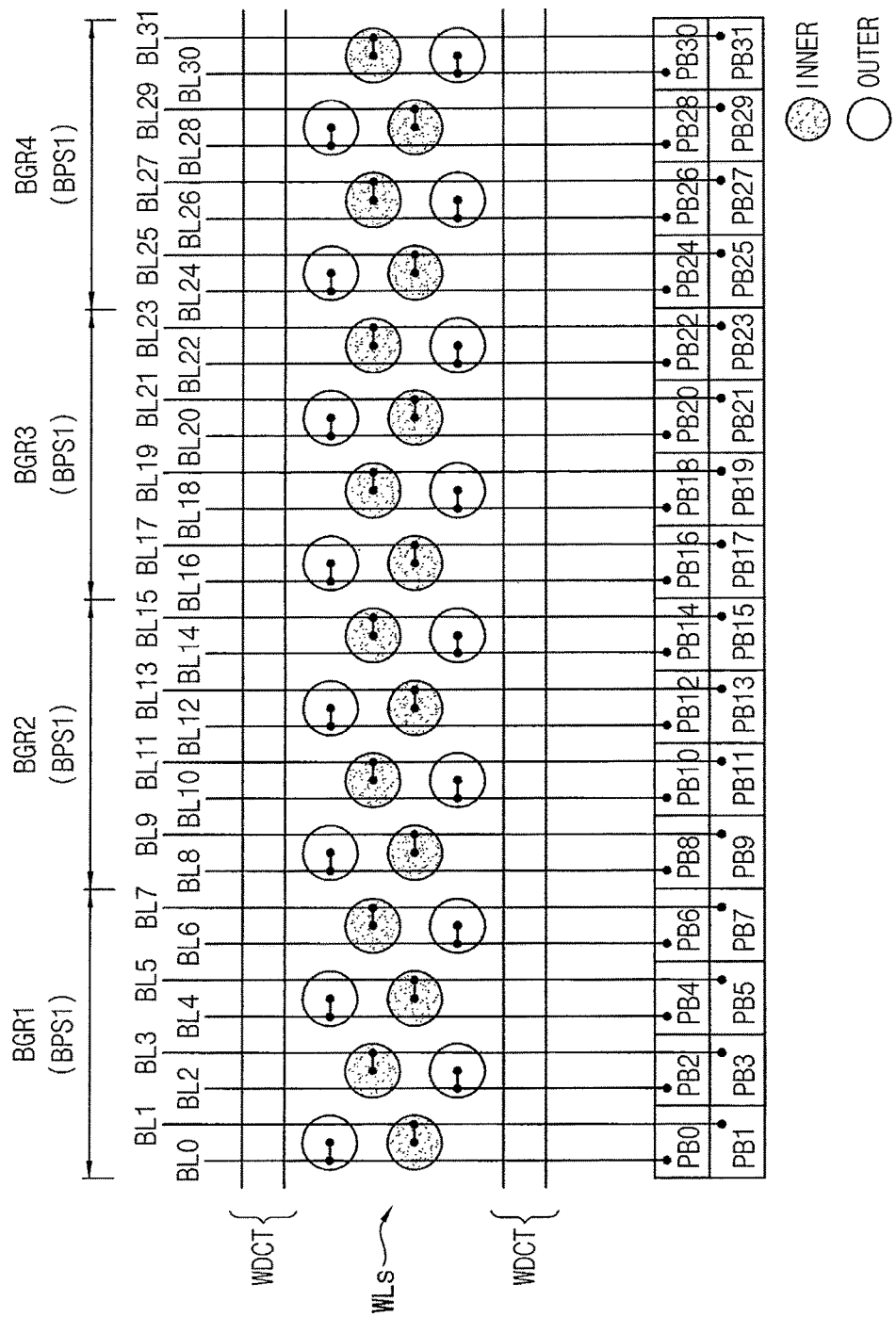
FIGS. 21 through 24 are diagrams illustrating connection structures between bit lines and page buffers according to an exemplary embodiment.
Figure 22:
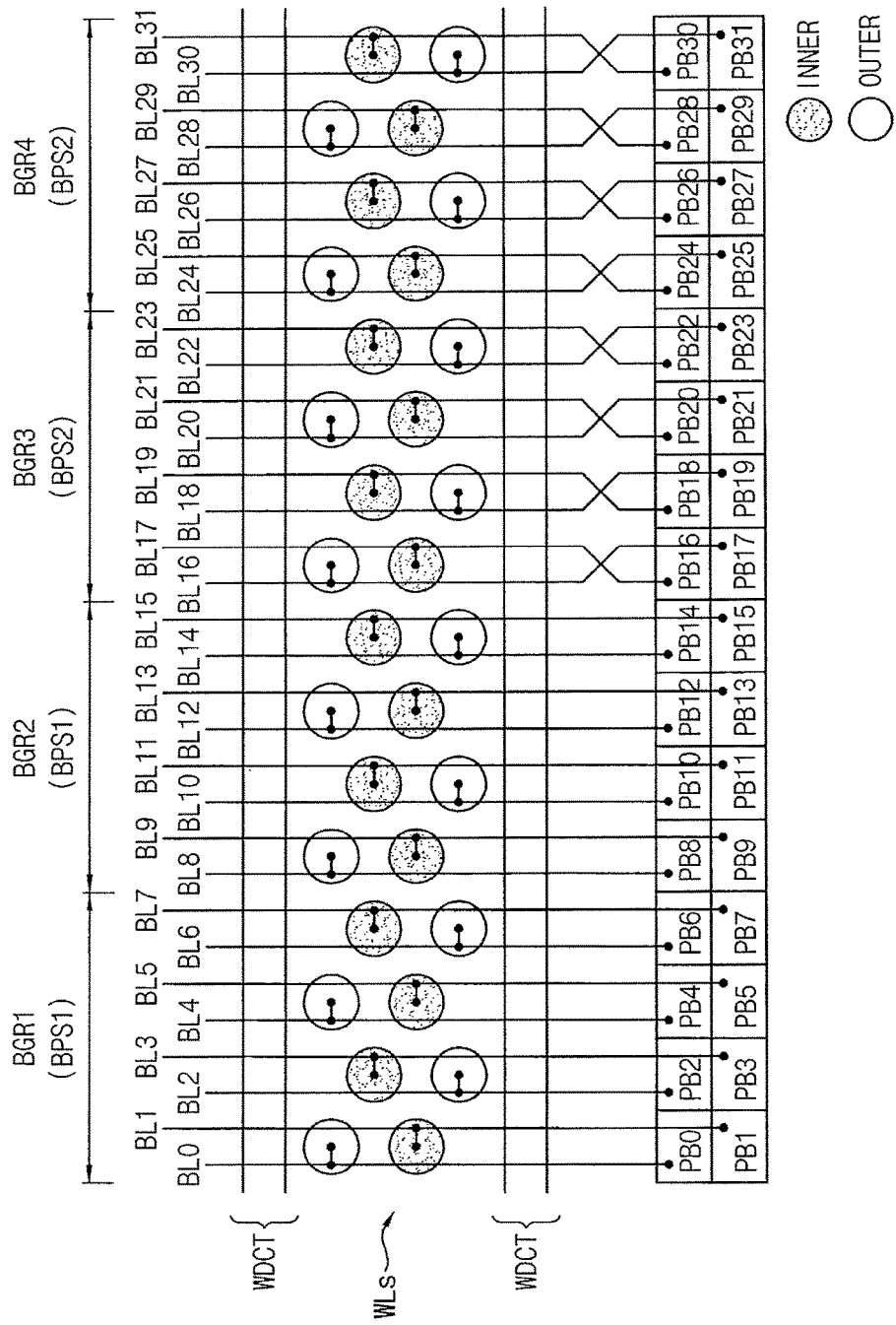
Figure 23:
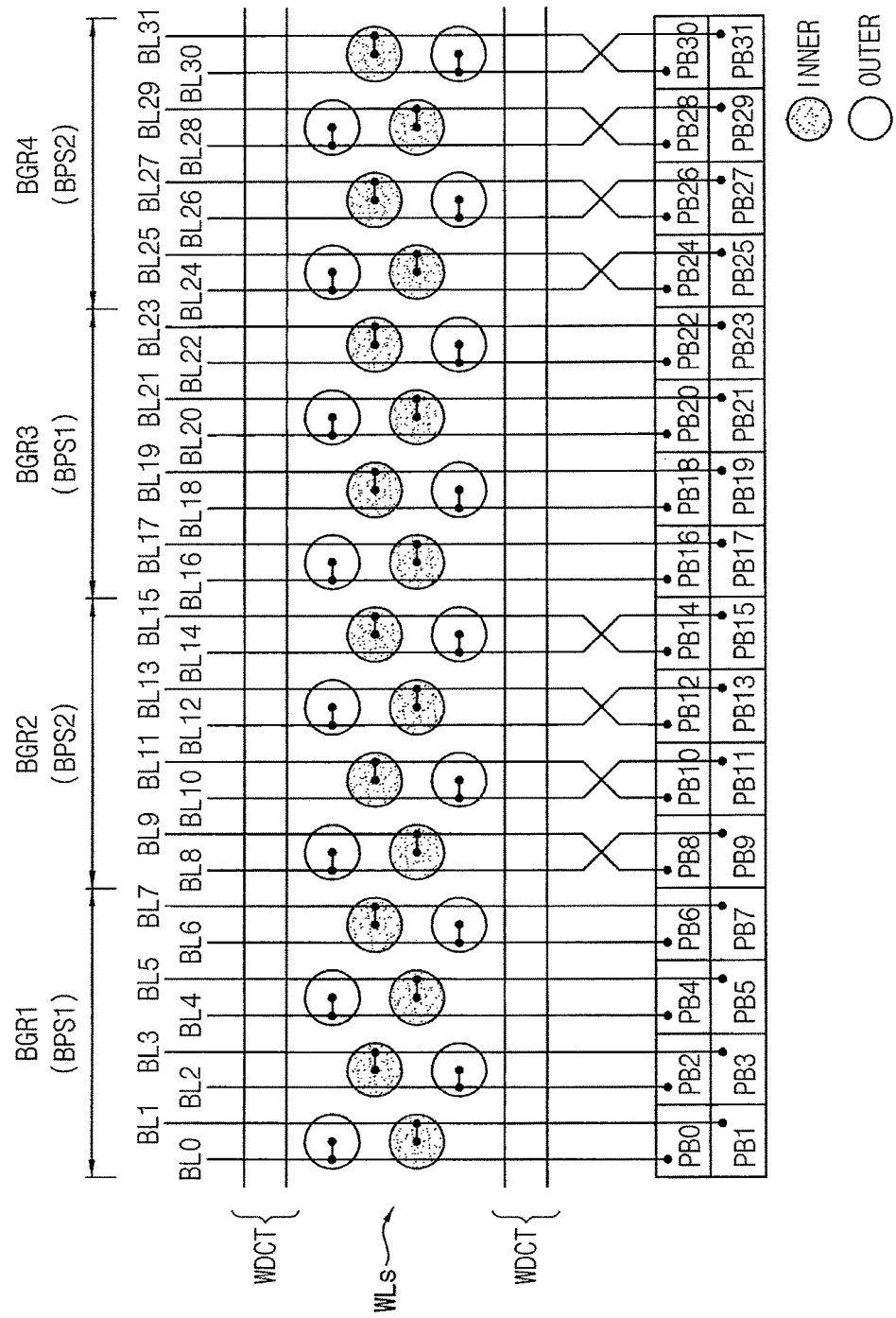
Figure 24:
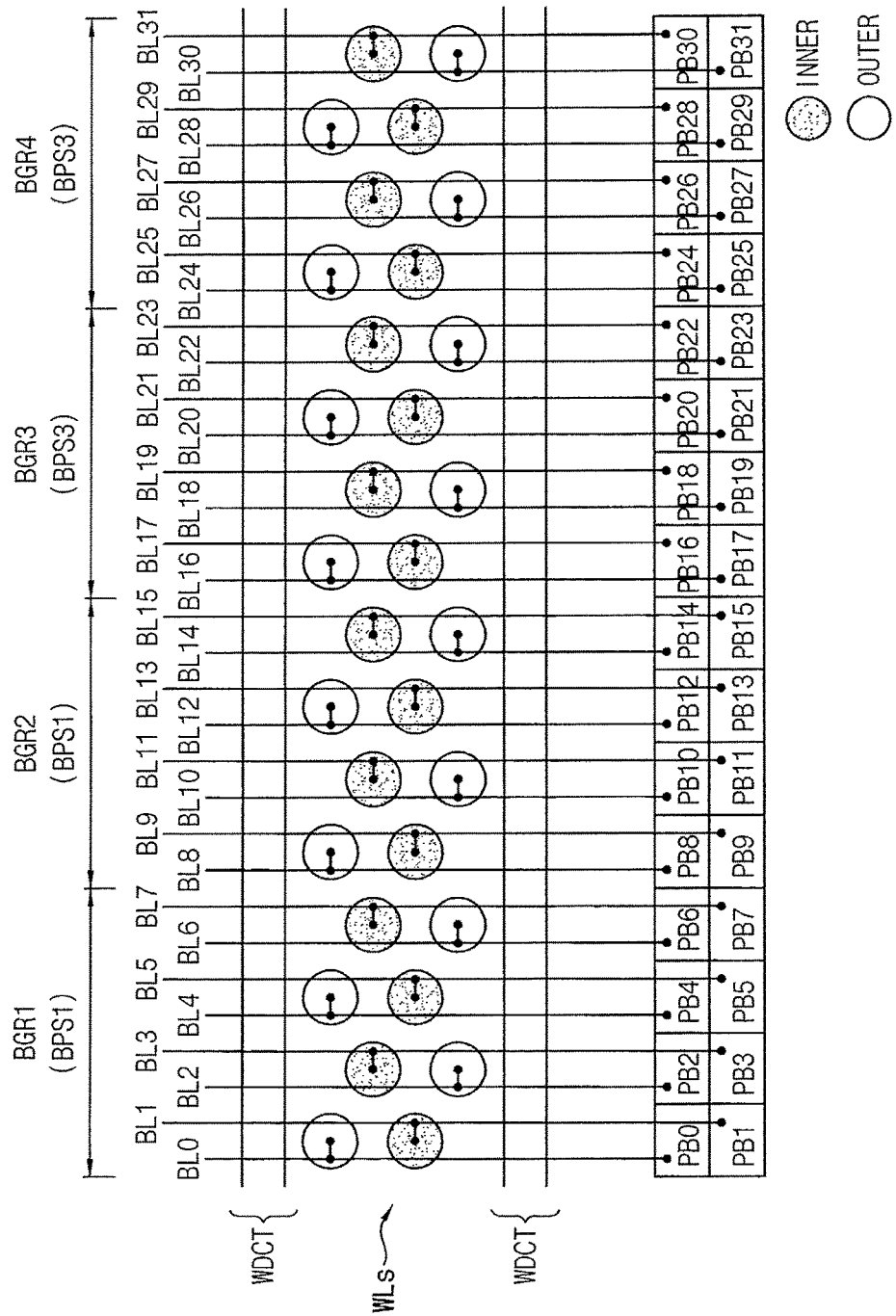

In FIGS. 21 through 24, each of the first through fourth bit line groups BGR1~BGR4 has the first connection structure such that the first connection scheme is applied to all of the bit line pairs in each bit line group. In other words, the connection structure between the memory cells and the bitlines of FIGS. 21 and 24 is the same as that of FIG. 11.

Hereinafter, a third connection scheme is defined such that, with respect to each bit line pair, an even-numbered bit line is connected to an even-numbered page buffer and an odd-number bit line is connected to an odd-numbered page buffer, and a fourth connection scheme is defined such that, with respect to each bit line pair, an even-numbered bit line is connected to an odd-numbered page buffer and an odd-number bit line is connected to an even-numbered page buffer.

Referring to FIG. 21, each of the first through fourth bit line groups BGR1~BGR4 may have a first connection structure BPS1 such that the third connection scheme is applied to all of the bit line pairs in each bit line group. For example, the connection structure between the bitlines and the page buffers of FIG. 21 is the same as that of FIG. 9.

In this case, a data input-output order ORDB of the bit lines according to the connection structure of FIG. 21 and an arranged order ORDR of the inner cells and the outer cells are the same as those of FIG. 12. As illustrated in FIG. 12, when the size of the ECC sector is 8 bits, the first ECC sector ESEC1 and the second ECC sector ESEC2 includes only the outer cells, and the third ECC sector ESEC3 and the fourth ECC sector ESEC4 includes only the inner cells.

As described with reference to FIGS. 1 and 2, when only the memory cells of the same characteristic are concentrated in each logical ECC sector, the maximum error bit level or the maximum number of the error bits in each ECC sector is determined by the worse characteristic. According to an exemplary embodiment, the data input-output order of the memory cells may be arranged so that the memory cells of the worse characteristic need not be concentrated in the same ECC sector, thereby decreasing the maximum error bit level.

Referring to FIG. 22, each of the first and second bit line groups BGR1 and BGR2 may have a first connection structure BPS1 such that the third connection scheme is applied to all of the bit line pairs in each bit line group, and each of the third and fourth bit line groups BGR3 and BGR4 may have a second connection structure BPS2 such that the fourth connection scheme is applied to all of the bit line pairs in each bit line group.

In this case, a data input-output order ORDB of the bit lines according to the connection structure of FIG. 22 and an arranged order ORDR of the inner cells and the outer cells are the same as those of FIG. 14. As illustrated in FIG. 14, when the size of the ECC sector is 8 bits, each of the first through fourth ECC sectors ESEC1~ESEC4 includes the same number of the outer cells and the inner cells because the two outer cells and the two inner cells are interleaved and arranged alternatively.

Referring to FIG. 23, each of the first and third bit line groups BGR1 and BGR3 may have a first connection structure BPS1 such that the third connection scheme is applied to all of the bit line pairs in each bit line group, and each of the second and fourth bit line groups BGR2 and BGR4 may have a second connection structure BPS2 such that the fourth connection scheme is applied to all of the bit line pairs in each bit line group.

In this case, a data input-output order ORDB of the bit lines according to the connection structure of FIG. 23 and an arranged order ORDR of the inner cells and the outer cells are the same as those of FIG. 16. As illustrated in FIG. 16, when the size of the ECC sector is 8 bits, each of the first through fourth ECC sectors ESEC1~ESEC4 includes the same number of the outer cells and the inner cells because the one outer cell and the one inner cell are interleaved and arranged alternatively.

In FIG. 22, the even-numbered bit line and the odd-numbered bit line in the same bit line pair may be maintained parallel to implement the third connection scheme, and in FIG. 24, the even-numbered bit line and the odd-numbered bit line in the same bit line pair may be crossed to implement the fourth connection scheme. The fourth connection scheme may be implemented by different methods.

In an exemplary embodiment, as illustrated in FIG. 24, the lengths of the even-numbered bit line and the odd-numbered bit line in the same bit line pair may be changed to implement the third connection scheme or the fourth connection scheme.

Referring to FIG. 24, each of the first and second bit line groups BGR1 and BGR2 may have a first connection structure BPS1 such that the third connection scheme is applied to all of the bit line pairs in each bit line group, and each of the third and fourth bit line groups BGR3 and BGR4 may have a third connection structure BPS3 such that the fourth connection scheme is applied to all of the bit line pairs in each bit line group. While the second connection structure BPS2 in FIGS. 22 and 23 is implemented by crossing the even-numbered bit line and the odd-numbered bit line in the same bit line pair for the fourth connection scheme, the third connection structure BPS3 in FIG. 24 is implemented by increasing the length of the even-numbered bit line and decreasing the length of the odd-numbered bit line for the fourth connection scheme.

In this case, a data input-output order ORDB of the bit lines according to the connection structure of FIG. 24 and an arranged order ORDR of the inner cells and the outer cells are the same as those of FIG. 14. As illustrated in FIG. 14, when the size of the ECC sector is 8 bits, each of the first through fourth ECC sectors ESEC1~ESEC4 includes the same number of the outer cells and the inner cells because the two outer cells and the two inner cells are interleaved and arranged alternatively.

As described with reference to FIGS. 21 through 24, the connection structure between the bit lines and the page buffers may be determined such that the same number of the outer cells and the inner cells are included in each of the ECC sectors. Through the uniformalization of the error bit levels according to cell characteristics, the maximum error bit level of the entire ECC sectors may be decreased.

According to an exemplary embodiment, a connection structure between decoded address signals and a read-write circuit may be determined such that the memory cells of the respective cell groups may be included uniformly in each of the ECC sectors.

For example, a first decoded address signal may be connected to some even-numbered page buffers and a second decoded address signal may be connected to the odd-numbered page buffers paired with the some even-numbered page buffers. In contrast, the second decoded address signal may be connected to the other even-numbered page buffers and the first decoded address signal may be connected to the odd-numbered page buffers paired with the other even-numbered page buffers. In FIGS. 25 through 27, the first decoded address signal may correspond to the first latch signal L0 and the second decoded address signal may correspond to the second latch signal L1, which are described with reference to FIGS. 9 and 10.

Figure 25:
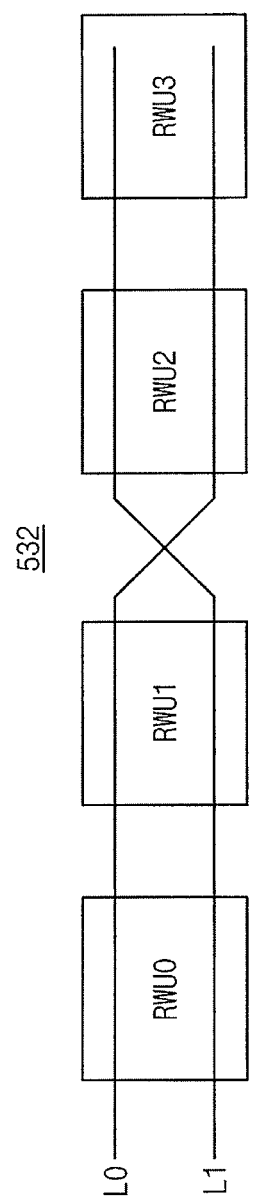
FIG. 25 is a diagram illustrating a connection structure between decoded address signals and a read-write circuit according to an exemplary embodiment.

FIG. 25 is a diagram illustrating a connection structure between decoded address signals and a read-write circuit according to an exemplary embodiment.

Referring to FIG. 25, a read-write circuit 532 may include a first read-write unit RWU0, a second read-write unit RWU1, a third read-write unit RWU2 and a fourth read-write unit RWU3.

The configuration of the read-write circuit 532 of FIG. 25 may be substantially the same as the configuration of the read-write circuit 531 of FIG. 9, except the connection structure between the decoded address signals and the page buffers. In the read-write circuit 531 of FIG. 9, the first latch signal L0 is applied to the page buffers of the first row and the second latch signal L1 is applied to the page buffers of the second row with respect to all of the first through fourth read-write units RWU0~RW3. In the read-write circuit 532 of FIG. 25, the first latch signal L0 is applied to the page buffers of the first row and the second latch signal L1 is applied to the page buffers of the second row with respect to the first and second read-write units RWU0 and RW1, whereas the first latch signal L0 is applied to the page buffers of the second row and the second latch signal L1 is applied to the page buffers of the first row with respect to the third and fourth read-write units RWU2 and RW3.

Figure 26:
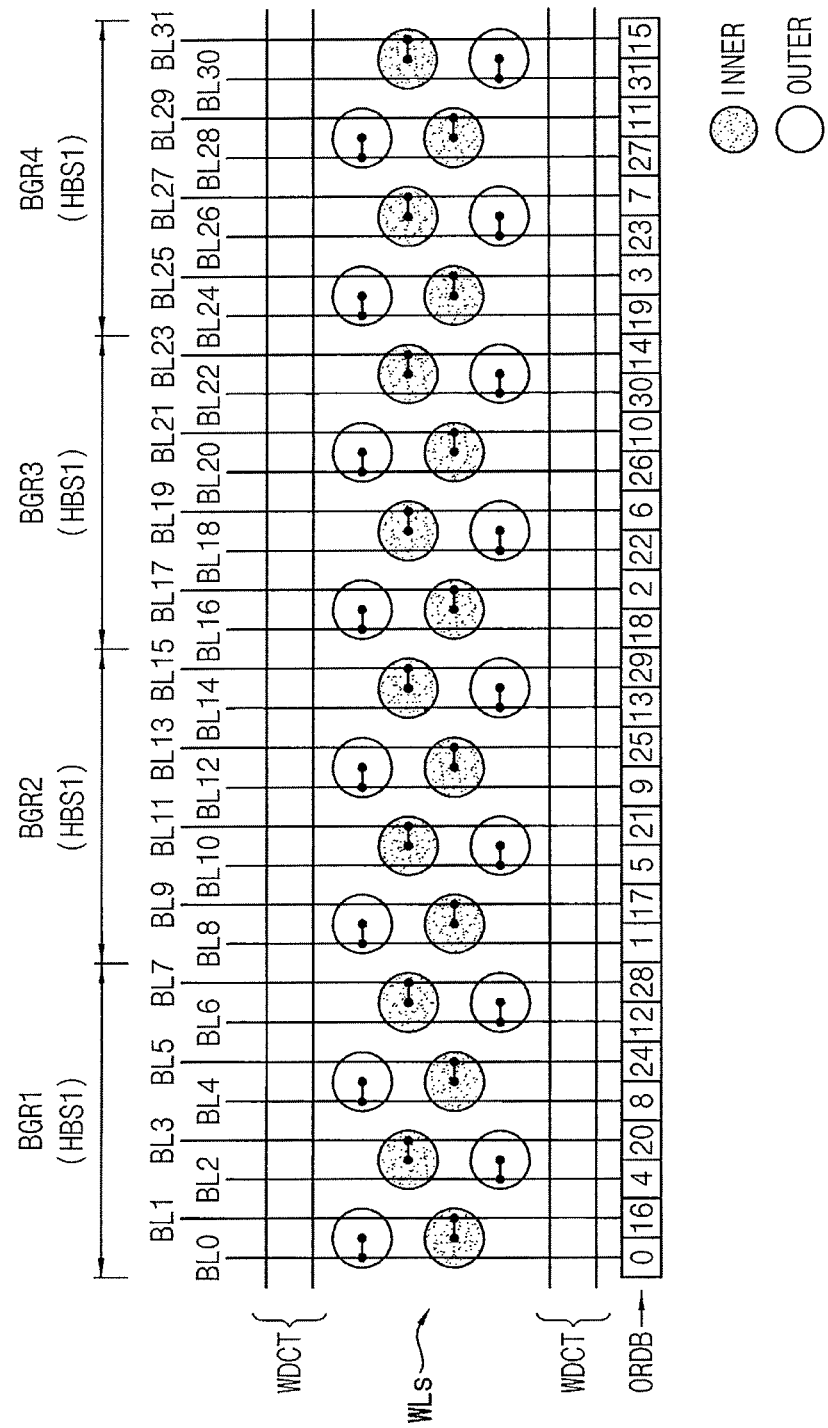
FIGS. 26 and 27 are diagrams illustrating a data input-output order according to the connection structure of FIG. 25.
Figure 27:
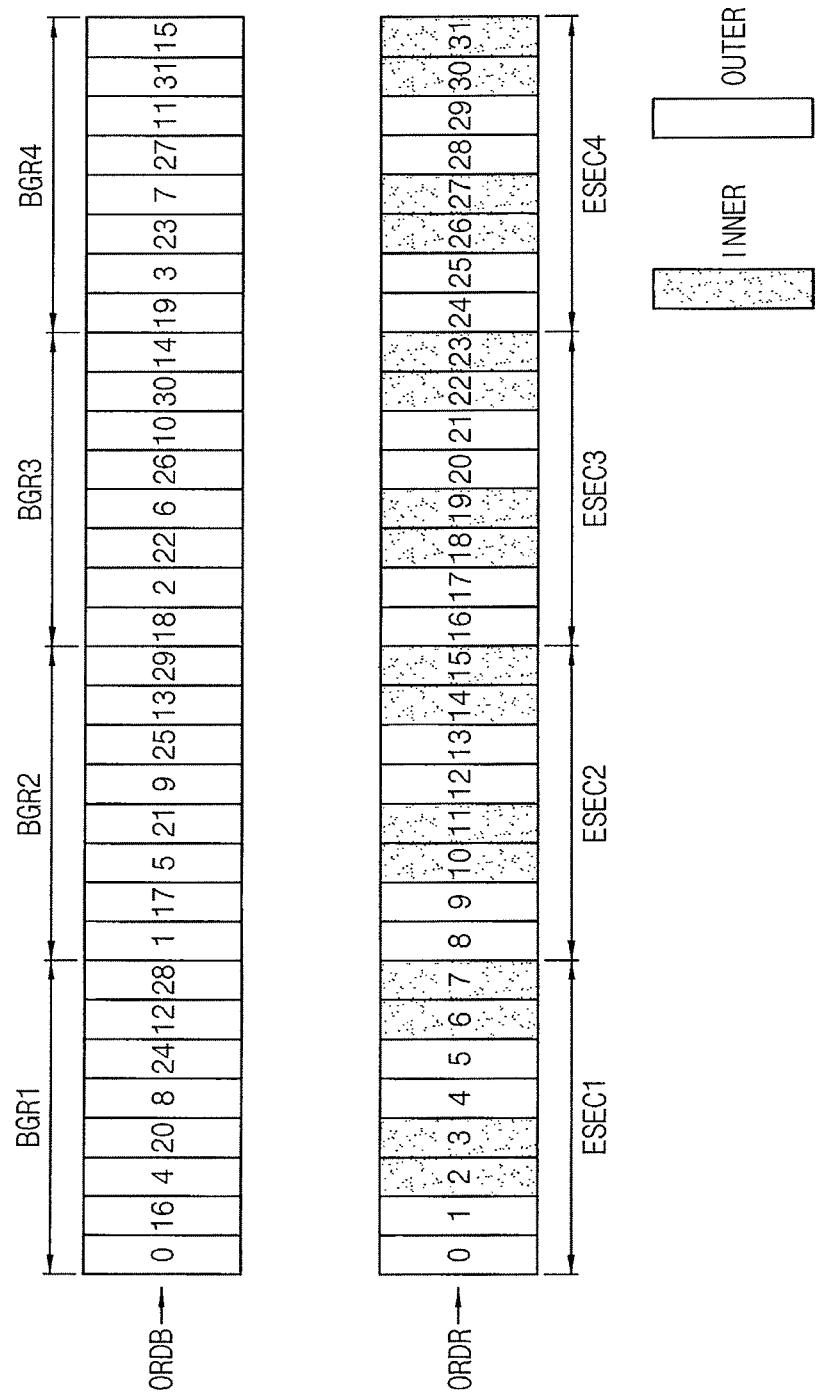

FIGS. 26 and 27 are diagrams illustrating a data input-output order according to the connection structure of FIG. 25.

Referring to FIG. 26, each of the first through fourth bit line group BGR1~BGR4 may have a first connection structure HBS1 such that the first connection scheme is applied to all of the bit line pairs in each bit line group. In the bottom portion of FIG. 26, the data input-output order ORDB is illustrated for the case that the read-write circuit 532 of FIG. 25 and the address decoding of FIG. 10 are applied and the value "A2A1A0" of the address bits A0, A1 and A2 is increased from "000" to "111".

FIG. 27 illustrates a data input-output order ORDB of the bit lines according to the connection structure of FIG. 26 and an arranged order ORDR of the inner cells and the outer cells. When the size of the ECC sector is 8 bits, each of the first through fourth ECC sectors ESEC1~ESEC4 includes the same number of the outer cells and the inner cells because the two outer cells and the two inner cells are interleaved and arranged alternatively.

As described with reference to FIGS. 25 through 27, the connection structure between the decoded address signals and the page buffers may be determined such that the same number of the outer cells and the inner cells are included in each of the ECC sectors. Through the uniformalization of the error bit levels according to cell characteristics, the maximum error bit level of the entire ECC sectors may be decreased.

Figure 28:
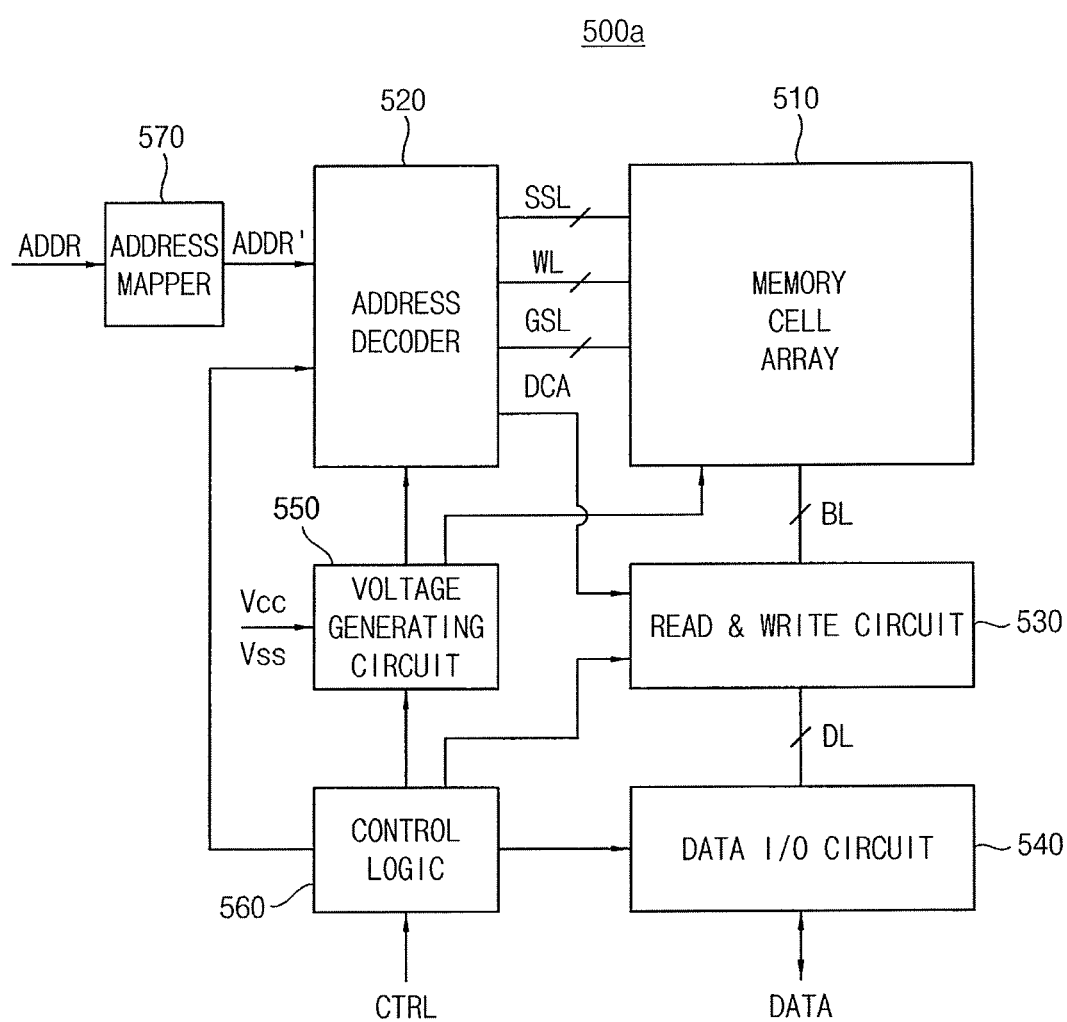
FIG. 28 is a block diagram illustrating a memory device according to an exemplary embodiment.

FIG. 28 is a block diagram illustrating a memory device according to an exemplary embodiment.

Referring to FIG. 28, a memory device 500a includes a memory cell array 510, an address decoder 520, a read-write circuit 530, a data input/output (I/O) circuit 540, a voltage generating circuit 550, a control logic 560 and an address mapper 570.

The memory device 500a of FIG. 28 is substantially the same as the memory device 500 of FIG. 4 and thus the repeated descriptions may be omitted. Compared with the memory device 500 of FIG. 4, the memory device 500a of FIG. 28 further includes the address mapper 570.

The address mapper 570 may change the address ADDR and provide the changed address ADDR' to the address decoder 520 such that the same number of the outer cells and the inner cells may be included in each of the ECC sectors. In an exemplary embodiment, as described below with reference to FIGS. 29 and 30, the address mapper 570 may change only the column address from the received address ADDR.

Figures 29, 30:
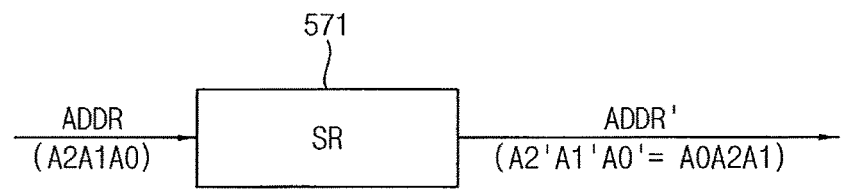
FIG. 29 is a diagram illustrating an address mapper included in the memory device of FIG. 28 according to an exemplary embodiment.
FIG. 30 is a diagram illustrating decoded address signals provided to the read-write circuit of FIG. 9 based on changed address according to an exemplary embodiment.

FIG. 29 is a diagram illustrating an address mapper included in the memory device of FIG. 28 according to an exemplary embodiment.

Referring to FIG. 29, the address mapper 571 may include a shift register SR. The shift register SR may shift at least a portion A2, A1 and A0 of the bits of the address ADDR to output the changed address ADDR'. For example, as illustrated in FIG. 29, the changed address ADDR' may include the bits A2'A1'A0' corresponding to A0A2A1 which are shifted from the bits A2A1A0 of the received address ADDR.

FIG. 30 is a diagram illustrating decoded address signals provided to the read-write circuit of FIG. 9 based on changed address according to an exemplary embodiment.

The address decoder 520 in FIG. 28 may generate decoded address signals L0, L1, Y0, Y1, Y2 and Y3 based on first, second and third address bits A0', A1' and A2' that are included in the changed address ADDR'. The decoded address signals L0, L1, Y0, Y1, Y2 and Y3 may include the latch signals L0 and L1 and the column selection signals Y0~Y3 as described with reference to FIG. 9.

As described with reference to FIG. 30, the latch signals L0 and L1 may be generated based on the third address bit A2', and the column selection signals Y0~Y3 may be generated based on the first and second address bits A0' and A1'.

When the third address bit A2' is "0", the first latch signal L0 may be in the logic high level H and the second latch signal L1 may be in the logic low level L. In contrast, the third address bit A2' is "1", the first latch signal L0 may be in the logic low level L and the second latch signal L1 may be in the logic high level H.

When the value "A1'A0'" of the second address bit A1' and the first address bit A0 is "00", the first column selection signal Y0 is in the logic high level H and the other column selection signals Y1, Y2 and Y3 are in the logic low level L. When the value "A1'A0'" of the second address bit A1' and the first address bit A0' is "01", the second column selection signal Y1 is in the logic high level H and the other column selection signals Y0, Y2 and Y3 are in the logic low level L. When the value "A1'A0'" of the second address bit A1' and the first address bit A0' is "10", the third column selection signal Y2 is in the logic high level H and the other column selection signals Y0, Y1 and Y3 are in the logic low level L. When the value "A1'A0'" of the second address bit A1' and the first address bit A0' is "11", the fourth column selection signal Y3 is in the logic high level H and the other column selection signals Y0, Y1 and Y2 are in the logic low level L.

When the value "A2A1A0" of the address bits A0, A1 and A2 in the received address ADDR is "000", the value "A2'A1'A0'" of the address bits A0', A1' and A2' in the changed address ADDR' is "000" and the read-write circuit 531 of FIG. 9 may connect the first bit line BL0, the ninth bit line BL8, the seventeenth bit line BL16 and the twenty fifth bit line BL24 to the first through fourth data lines DL0~DL3, respectively. When the value "A2A1A0" of the address bits A0, A1 and A2 in the received address ADDR is increased by one to be "001", the value "A2'A1'A0'" of the address bits A0', A1' and A2' in the changed address ADDR' is "100" and the read-write circuit 531 may connect the second bit line BL1, the tenth bit line BL9, the eighteenth bit line BL17 and the twenty sixth bit line BL25 to the first through fourth data lines DL0~DL3, respectively.

Figure 31:
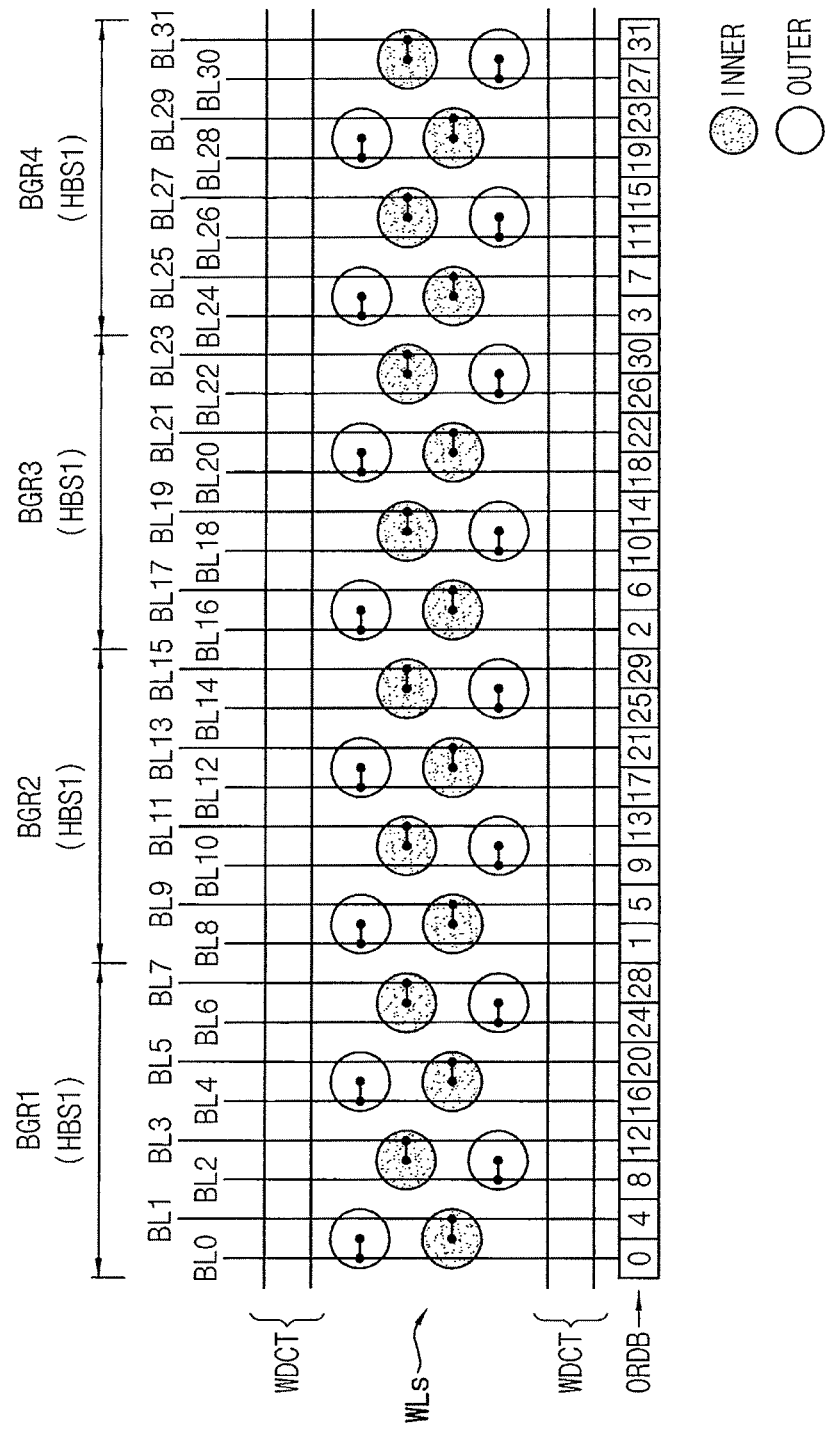
FIGS. 31 and 32 are diagrams illustrating a data input-output order according to the address change of FIG. 30.
Figure 32:
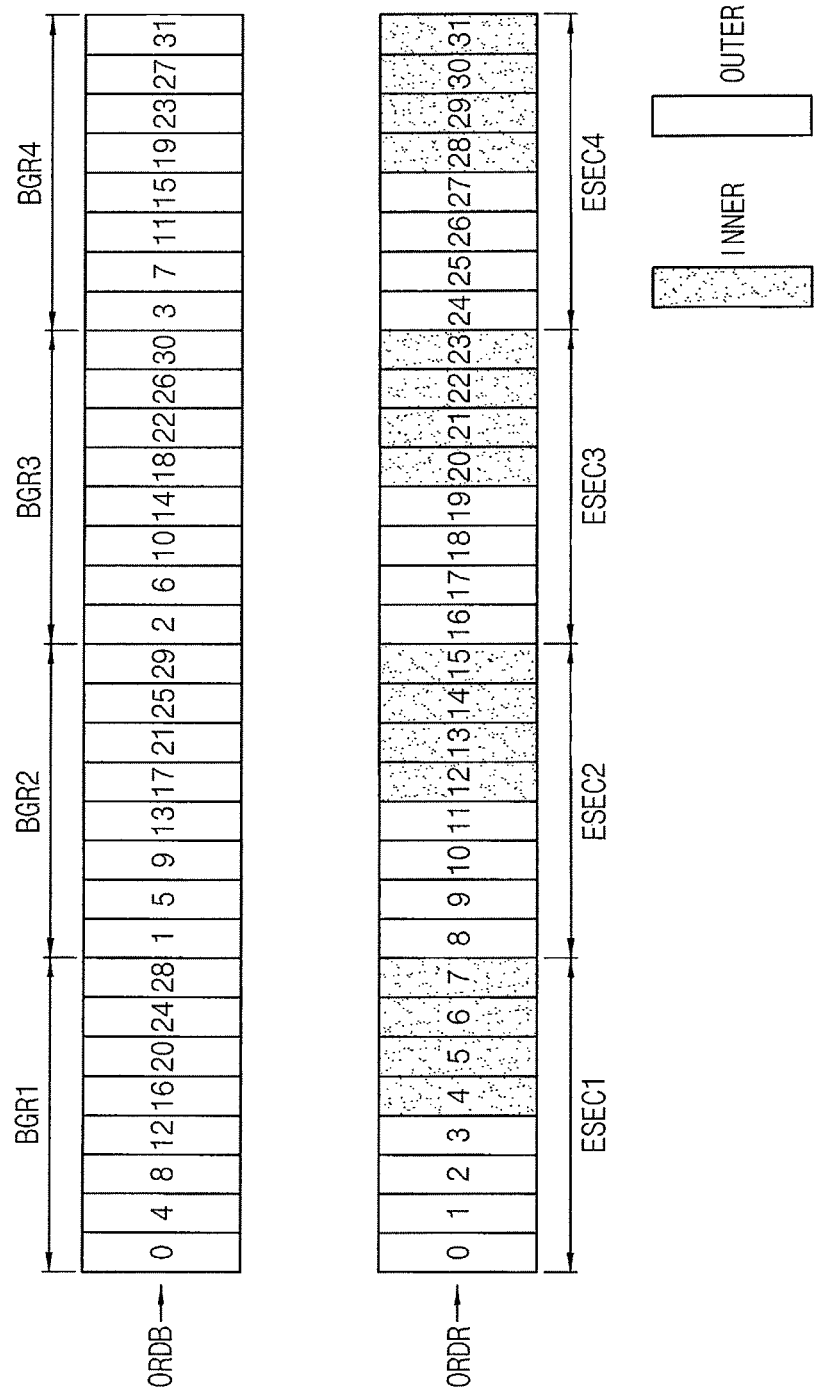

As such, the data input-output order ORDB of the bit lines is illustrated in FIGS. 31 and 32 for a case that the value "A2A1A0" of the address bits A0, A1 and A2 in the original address ADDR is increased from "000" to "111".

FIGS. 31 and 32 are diagrams illustrating a data input-output order according to the address change of FIG. 30.

Referring to FIG. 31, each of the first through fourth bit line groups BGR1~BGR4 may have a first connection structure HBS1 such that the first connection scheme is applied to all of the bit line pairs in each bit line group. In the bottom portion of FIG. 31, the data input-output order ORDB is illustrated for the case that the read-write circuit 531 of FIG. 9 and the address decoding of FIG. 30 are applied and the value "A2A1A0" of the address bits A0, A1 and A2 in the original address ADDR is increased from "000" to "111".

FIG. 32 illustrates a data input-output order ORDB of the bit lines according to the connection structure of FIG. 31 and an arranged order ORDR of the inner cells and the outer cells. When the size of the ECC sector is 8 bits, each of the first through fourth ECC sectors ESEC1~ESEC4 includes the same number of the outer cells and the inner cells because the four outer cells and the four inner cells are interleaved and arranged alternatively.

As described with reference to FIGS. 28 through 32, an address that is input to an address decoder may be changed such that the same number of the outer cells and the inner cells are included in each of the ECC sectors. Through the uniformalization of the error bit levels according to cell characteristics, the maximum error bit level of the entire ECC sectors may be decreased.

Figure 33:
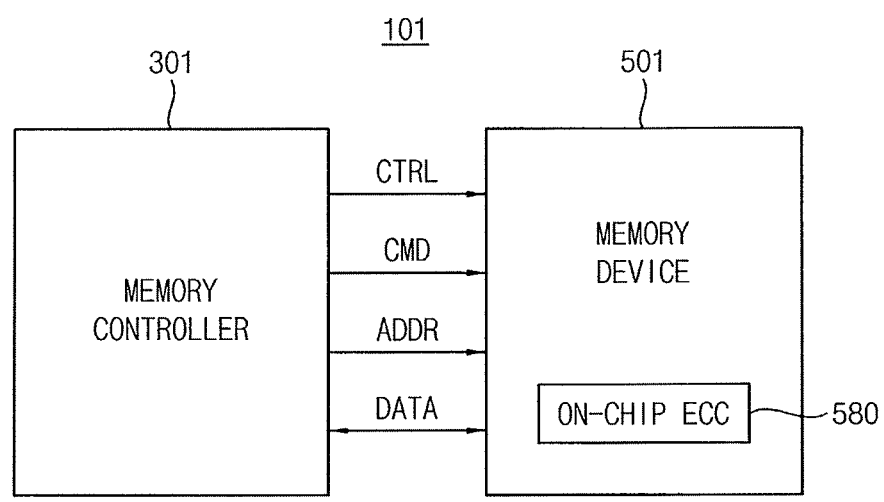
FIG. 33 is a block diagram illustrating a memory system according to an exemplary embodiment.

FIG. 33 is a block diagram illustrating a memory system according to an exemplary embodiment.

Referring to FIG. 33, a memory system 101 may include a memory controller 301 and at least one memory device 501.

The memory device 501 may perform read, write and erase operations under control of the memory controller 301. The memory device 501 may receive control signals CTRL, commands CMD, addresses ADDR and write data DATA from the memory controller 301 and transmit read data DATA to the memory controller 301.

The memory device 501 may include an on-chip ECC circuit 580. When the data are written in the memory cell array, the on-chip ECC circuit 580 may encode the data to generate parity bits. For example, the parity bits may be stored in a parity data region in the memory cell array. When the data are read out from the memory cell array, the on-chip ECC circuit 580 may decode the read data and the parity bits to check and correct the bit errors. The on-chip ECC circuit 580 may include an encoder and a decoder for performing such encoding and decoding.

Figure 34:
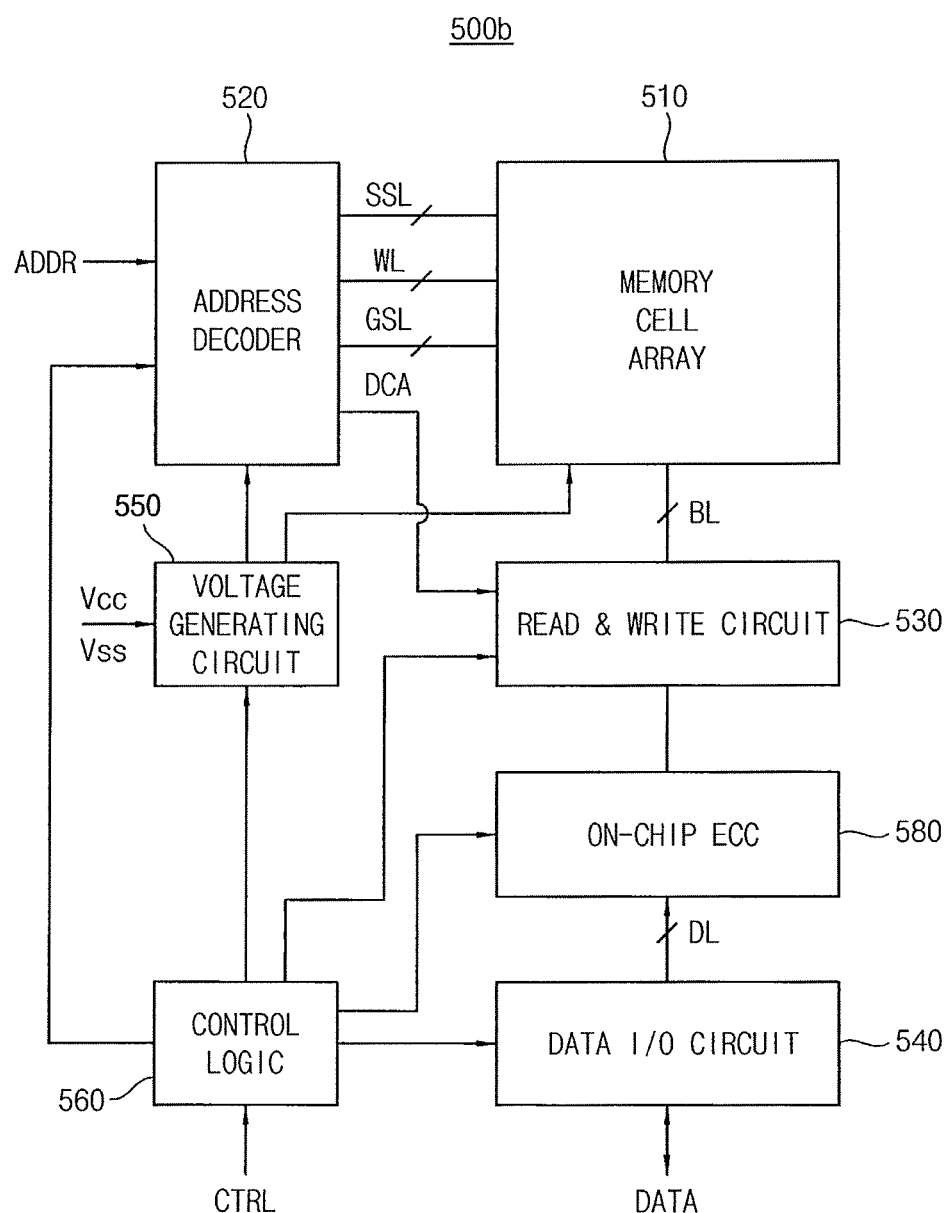
FIG. 34 is a block diagram illustrating an example of a memory device included in the memory system of FIG. 33.

FIG. 34 is a block diagram illustrating an example of a memory device included in the memory system of FIG. 33.

Referring to FIG. 34, a memory device 500b includes a memory cell array 510, an address decoder 520, a read-write circuit 530, a data input/output (I/O) circuit 540, a voltage generating circuit 550, a control logic 560 and an on-chip ECC circuit 580.

The memory device 500b of FIG. 34 is substantially the same as the memory device 500 of FIG. 4 and thus the repeated descriptions may be omitted. Compared with the memory device 500 of FIG. 4, the memory device 500b of FIG. 34 further includes the on-chip ECC circuit 580.

The on-chip ECC circuit 580 may be disposed between the read-write circuit 530 and the data input/output circuit 540, and may perform the above-mentioned ECC encoding and ECC decoding.

Figure 35:
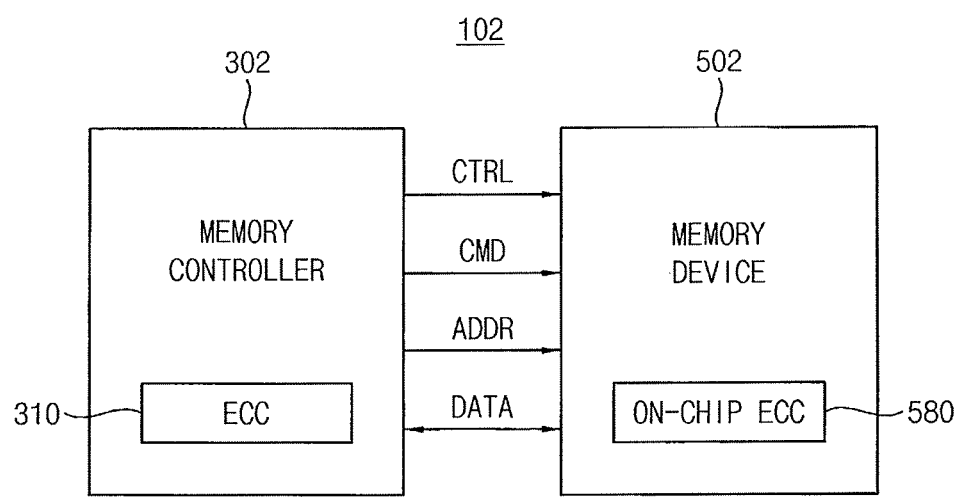
FIG. 35 is a block diagram illustrating a memory system according to an exemplary embodiment.

FIG. 35 is a block diagram illustrating a memory system according to an exemplary embodiment.

Referring to FIG. 35, a memory system 102 may include a memory controller 302 and at least one memory device 502.

The memory device 502 may perform read, write and erase operations under control of the memory controller 302. The memory device 502 may receive control signals CTRL, commands CMD, addresses ADDR and write data DATA from the memory controller 302 and transmit read data DATA to the memory controller 302.

The memory controller 302 may include an ECC engine 310 and the memory device 502 may include an on-chip ECC circuit 580. The ECC engine 310 and the on-chip ECC circuit 580 are the same as described with reference to FIGS. 3 and 33.

The ECC engine 310 in the memory controller 302 and the on-chip ECC circuit 580 in the memory device 502 may have respective error correction capabilities different from each other. For example, the ECC engine 310 in the memory controller 302 may have the higher error correction capability than the on-chip ECC circuit 580 in the memory device 502. In this case, the ECC engine 310 may further check and correct the bit errors that cannot be corrected by the on-chip ECC circuit 580.

Figure 36:
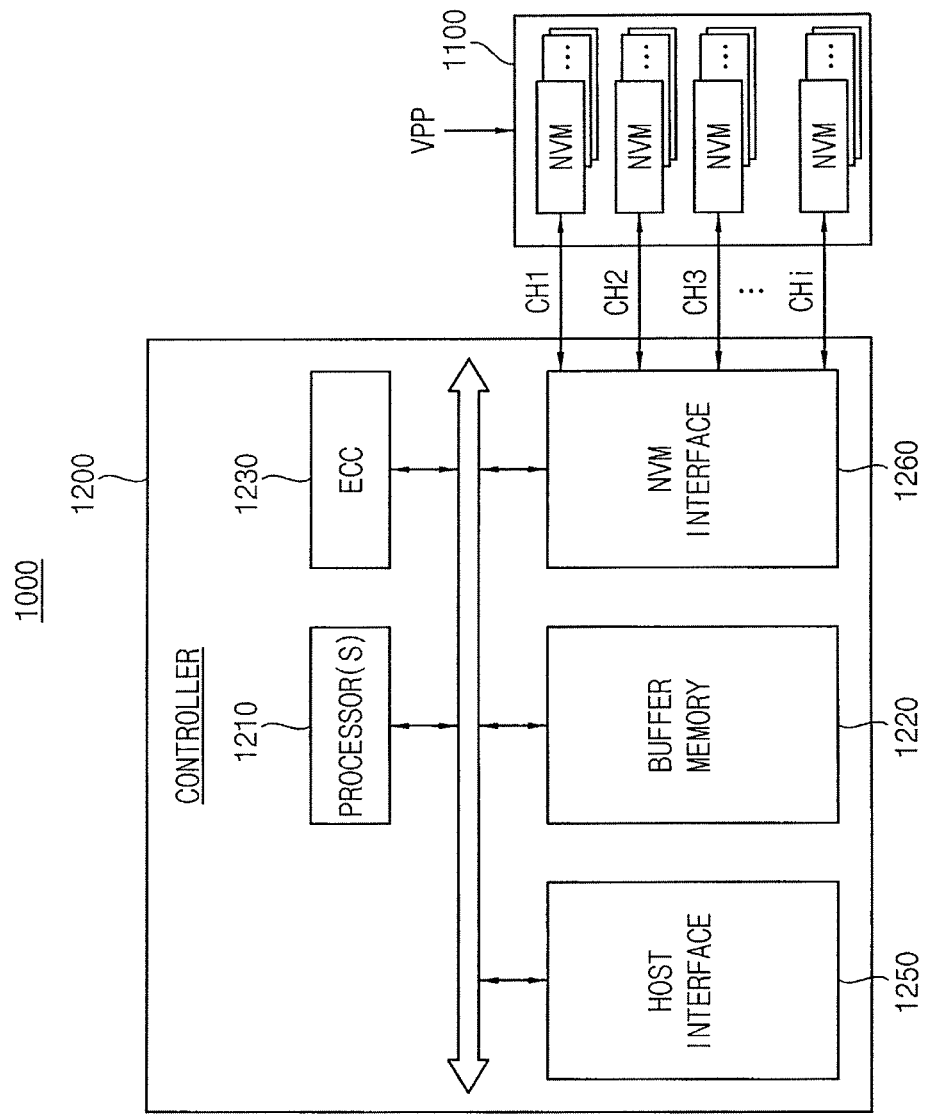
FIG. 36 is a block diagram illustrating a solid state disk or solid state drive (SSD) according to an exemplary embodiment.

FIG. 36 is a block diagram illustrating a solid state disk or solid state drive (SSD) according to an exemplary embodiment.

Referring to FIG. 36, an SSD 1000 includes multiple nonvolatile memory devices 1100 and an SSD controller 1200.

The nonvolatile memory devices 1100 may be optionally supplied with an external high voltage VPP. The nonvolatile memory devices 1100 may have a configuration for performing the above-described ECC control method. The nonvolatile memory devices 1100 may decrease the maximum error bit level of the ECC sector by uniformalizing the error bit levels according to cell characteristics, repair rate of the memory devices may be increased and thus yield, performance and lifetime of the non-volatile memory devices 1100 may be increased.

The SSD controller 1200 is connected to the nonvolatile memory devices 1100 through multiple channels CH1 to CHi. The SSD controller 1200 comprises one or more processors 1210, a buffer memory 1220, an ECC block 1230, a host interface 1250, and a nonvolatile memory interface 1260.

The buffer memory 1220 stores data used to drive the SSD controller 1200. The buffer memory 1220 comprises multiple memory lines each storing data or a command. Although FIG. 36 illustrates an exemplary embodiment where the buffer memory 1220 is included in the SSD controller 1200, the inventive concept is not limited thereto. For example, the buffer memory 1220 may be placed outside the SSD controller 1200.

The ECC block 1230 calculates error correction code values of data to be programmed at a writing operation and corrects an error of read data using an error correction code value at a read operation. In a data recovery operation, The ECC block 1230 corrects an error of data recovered from the nonvolatile memory devices 1100. Although not shown in FIG. 19, a code memory may be further included to store code data needed to drive the SSD controller 1200. The code memory may be implemented by a nonvolatile memory device.

The host interface 1250 provides an interface with an external device. The nonvolatile memory interface 1260 provides an interface with the nonvolatile memory devices 1100.

Figure 37:
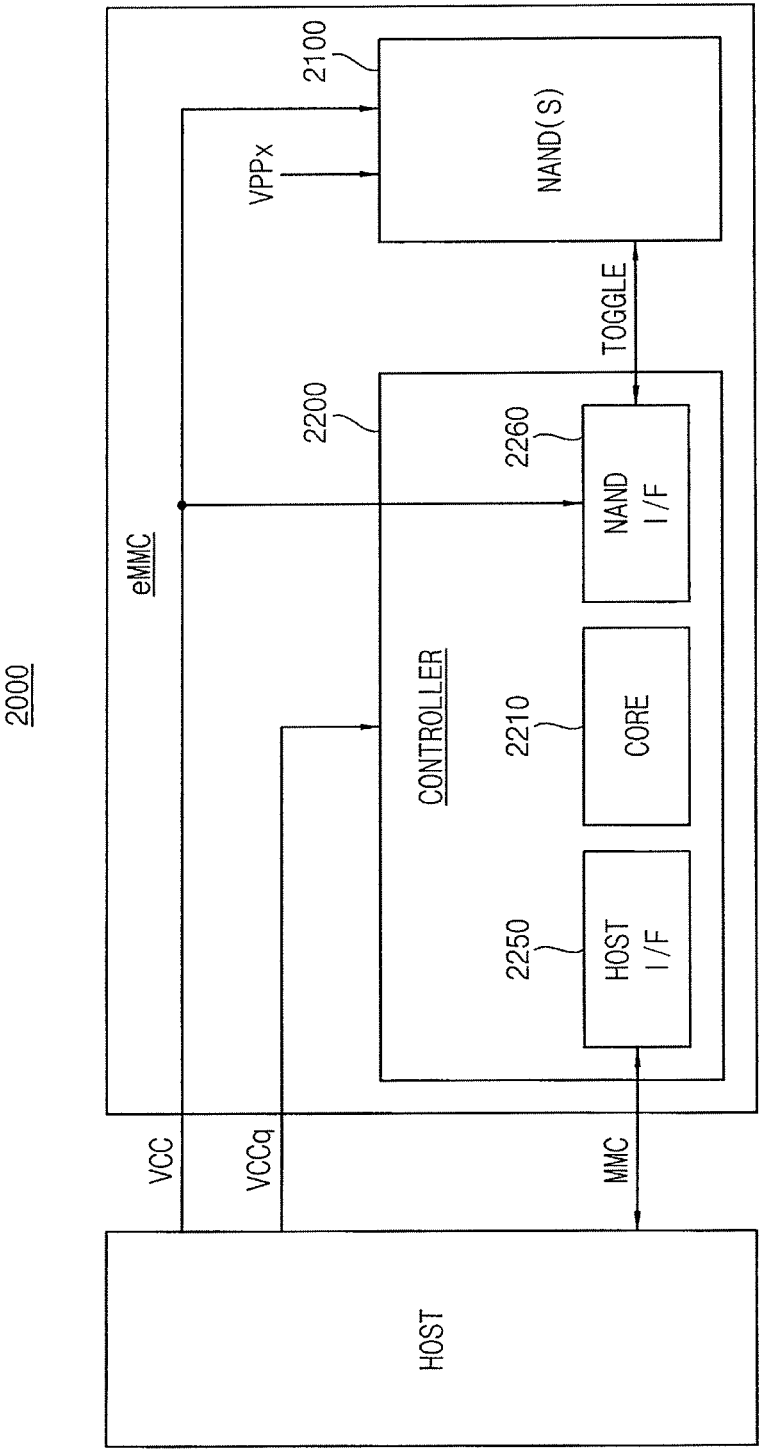
FIG. 37 is a block diagram illustrating an embedded multi-media card (eMMC) according to an exemplary embodiment.

FIG. 37 is a block diagram illustrating an embedded multi-media card (eMMC) according to an exemplary embodiment.

Referring to FIG. 37, an eMMC 2000 comprises one or more NAND flash memory devices 2100 and a controller 2200.

The NAND flash memory device 2100 may have a configuration for performing the above-described ECC control method. The NAND flash memory device 2100 may decrease the maximum error bit level of the ECC sector by uniformalizing the error bit levels according to cell characteristics, repair rate of the memory devices may be increased and thus yield, performance and lifetime of the NAND flash memory device 2100 may be increased.

The controller 2200 is connected to the NAND flash memory device 2100 via multiple channels. The controller 2200 includes one or more controller cores 2210, a host interface 2250, and a NAND interface 2260. The controller core 2210 controls an overall operation of the eMMC 2000.

The host interface 2250 is configured to perform an interface between the controller 2200 and a host. The NAND interface 2260 is configured to provide an interface between the NAND flash memory device 2100 and the controller 2200. In an exemplary embodiment, the host interface 2250 may be a parallel interface (e.g., an MMC interface). In an exemplary embodiment, the host interface 2250 of eMMC 2000 may be a serial interface (e.g., UHS-II, UFS, etc.).

The eMMC 2000 receives power supply voltages Vcc and Vccq from the host. For example, the power supply voltage Vcc (e.g., about 3.3V) is supplied to the NAND flash memory device 2100 and the NAND interface 2260, and the power supply voltage Vccq (e.g., about 1.8V/3.3V) is supplied to the controller 2200. In an exemplary embodiment, eMMC 2000 may be optionally supplied with an external high voltage VPPx.

Figure 38:
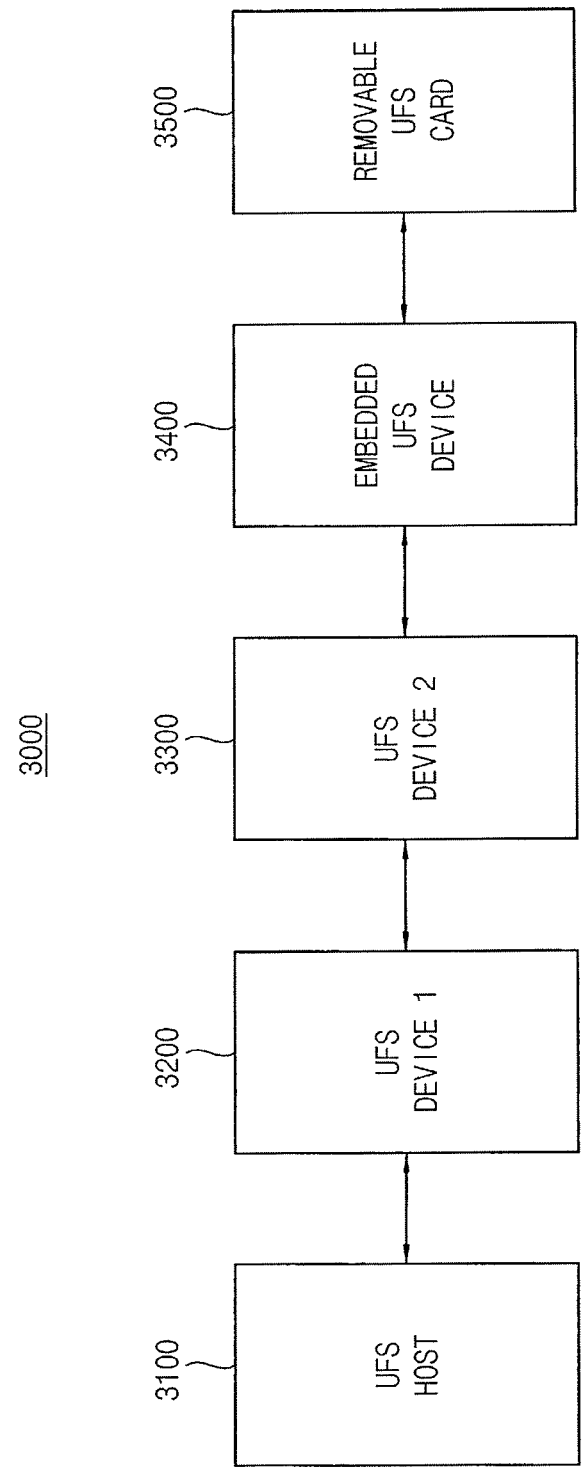
FIG. 38 is a block diagram illustrating a universal flash storage (UFS) according to an exemplary embodiment.

FIG. 38 is a block diagram illustrating a universal flash storage (UFS) according to an exemplary embodiment.

Referring to FIG. 38, a UFS system 3000 may include a UFS host 3100, UFS devices 3200 and 3300, an embedded UFS device 3400, and a removable UFS card 3500. The UFS host 3100 is an application processor of a mobile device. Each of the UFS host 3100, the UFS devices 3200 and 3300, the embedded UFS device 3400 and the removable UFS card 3500 communicate with external devices through the UFS protocol. At least one of the UFS devices 3200 and 3300, the embedded UFS device 3400, and the removable UFS card 3500 is implemented by a nonvolatile memory device. At least one of the UFS devices 3200 and 3300, the embedded UFS device 3400, and the removable UFS card 3500 may have a configuration for performing the above-described ECC control method.

Meanwhile, the embedded UFS device 3400 and the removable UFS card 3500 may perform communications using protocols different from the UFS protocol. The UFS host 3100 and the removable UFS card 3500 may communicate through various card protocols (e.g., UFDs, MMC, SD (secure digital), mini SD, Micro SD, etc.).

Figure 39:
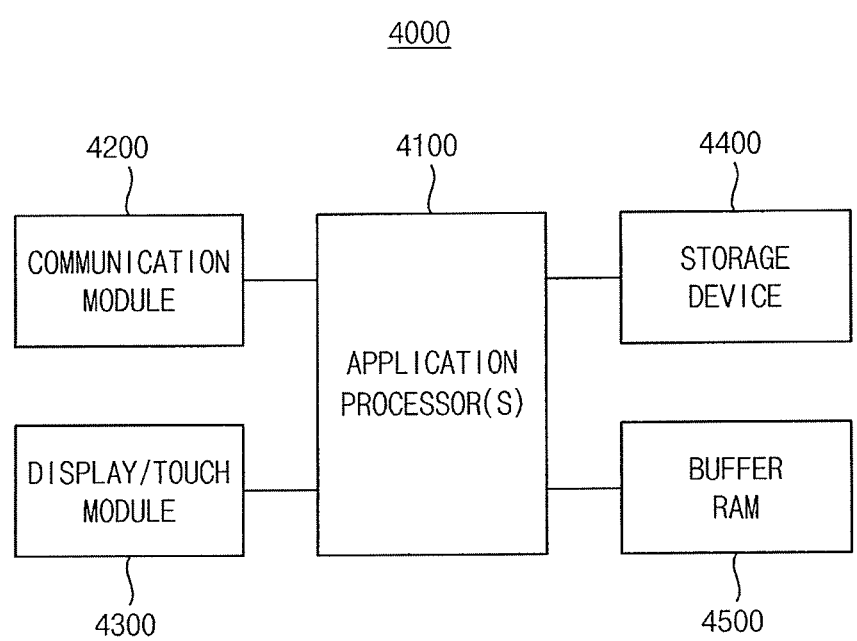
FIG. 39 is a block diagram illustrating a mobile device according to an exemplary embodiment.

FIG. 39 is a block diagram illustrating a mobile device according to an exemplary embodiment.

Referring to FIG. 39, a mobile device 4000 may include an application processor 4100, a communication module 4200, a display/touch module 4300, a storage device 4400, and a mobile RAM 4500.

The application processor 4100 controls operations of the mobile device 4000. The communication module 4200 is implemented to perform wireless or wire communications with an external device. The display/touch module 4300 is implemented to display data processed by the application processor 4100 or to receive data through a touch panel. The storage device 4400 is implemented to store user data. The storage device 4400 may be eMMC, SSD, UFS device, etc. The storage device 4400 may include a nonvolatile memory device. The storage device 4400 may have a configuration for performing the above-described ECC control method.

The mobile RAM 4500 temporarily stores data used for processing operations of the mobile device 4000.

A memory device or a storage device according to an exemplary embodiment of the inventive concept may be packaged using various package types or package configurations, such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), or the like.

As described above, the memory device and the method of controlling the ECC operation may decrease the maximum error bit level of the ECC sector by uniformalizing the error bit levels according to cell characteristics. Through decrease of the maximum error bit level, repair rate of the bad memory devices may be increased and thus yield, performance and lifetime of the memory devices may be increased.

The present disclosure may be applied to various devices and systems. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A non-volatile memory device comprising:
a memory cell array including a plurality of memory cells that are formed in a plurality of vertical channels extended in a vertical direction with respect to a substrate;
a read-write circuit connected to the memory cells via a plurality of bit lines; and
an address decoder configured to decode an address to provide a plurality of decoded address signals to the read-write circuit,
wherein the memory cells include a plurality of outer cells and a plurality of inner cells, a distance between one of the outer cells and a common source node being smaller than a distance between one of the inner cells and the common source node, and
wherein data of the memory cells are distributed among a plurality of ECC sectors and a data input-output order of the memory cells is arranged such that each of the ECC sectors has substantially the same number of the outer cells and the inner cells, each ECC sector corresponding to an ECC operation unit.

2. The non-volatile memory device of claim 1, wherein a connection structure between the memory cells and the bit lines is configured such that each of the ECC sectors has the same number of the outer cells and the inner cells.

3. The non-volatile memory device of claim 1, wherein a connection structure between the bit lines and page buffers in the read-write circuit is configured such that each of the ECC sectors has the same number of the outer cells and the inner cells.

4. The non-volatile memory device of claim 1, wherein a connection structure between the decoded address signals and page buffers in the read-write circuit is configured such that each of the ECC sectors has the same number of the outer cells and the inner cells.

5. The non-volatile memory device of claim 1, further comprising:
an address mapper configured to change the address and provide the changed address to the address decoder such that each of the ECC sectors has the same number of the outer cells and the inner cells.

6. The non-volatile memory device of claim 5, wherein the address mapper includes:
a shift register configured to shift at least a portion of bits of the address to output the changed address.

7. The non-volatile memory device of claim 1, further comprising two adjacent word line cut regions extended along a first direction, wherein the memory cells are disposed between the two adjacent word line cut regions; and
wherein the vertical channels include one outer vertical channel and one inner vertical channel which are disposed along a second direction crossing the first direction.

8. The non-volatile memory device of claim 7, further comprising an even-numbered bit line and an odd-numbered bit line; and
wherein one of the one outer vertical channel and the one inner vertical channel is connected to the even-numbered bit line and the other of the one outer vertical channel and the one inner vertical channel is connected to the odd-numbered bit line.

9. The non-volatile memory device of claim 1, wherein the read-write circuit includes:
page buffers arranged in a matrix form of rows and columns.

10. The non-volatile memory device of claim 1, wherein the vertical channels are arranged in a zig-zag manner in parallel to a first direction.

11. A memory device comprising:
a memory cell array including a plurality of memory cells;
a read-write circuit connected to the memory cells via a plurality of bit lines; and
an address decoder configured to decode an address to provide a plurality of decoded address signals to the read-write circuit,
wherein the plurality of memory cells includes a plurality of cell groups based on cell characteristics, memory cells of each cell group having the same cell characteristics, and
wherein data of the plurality of memory cells are distributed among a plurality of ECC sectors and a data input-output order of the memory cells is arranged such that each ECC sector has substantially the same number of memory cells of each cell group, each ECC sector corresponding to an ECC operation unit.

12. A method of operating an error check and correction (ECC) on a memory device, comprising:
receiving N bits from N memory cells of the memory device as an ECC operation unit, wherein each of the N memory cells has one cell characteristic of N cell characteristics and the ECC operation unit has substantially the same number of bits for each cell characteristic;
rearranging a data input-output order of the N memory cells according to the cell characteristic; and
performing an ECC algorithm on the N bits of the N memory cells.

13. The method of claim 12, wherein the cell characteristic includes a distance between a bit line and a common source node which are connected to each other through a vertical channel, wherein the bit line is extended in a first direction and the common source node is extended in a second direction crossing the first direction, and the vertical channel is extended in a third direction substantially perpendicular to the first and second directions.

14. The method of claim 12, wherein the cell characteristic includes a distance between a bit line and a corresponding page buffer.

15. The method of claim 12, further comprising:
performing an address mapping on a portion of the address to generate a changed address, so that the ECC operation unit has substantially the same number of bits for each cell characteristic.

16. The method of claim 15, wherein the portion of the address is selected from at least three lowest significant bits of the address.

17. A method of operating an error check and correction (ECC) on a memory device, comprising:
receiving N bits from N memory cells of the memory device as an ECC operation unit, wherein each of the N memory cells has one cell characteristic of N cell characteristics and the ECC operation unit has substantially the same number of bits for each cell characteristic; and
performing an ECC algorithm on the N bits, wherein the ECC algorithm is performed on the N bits that renders a substantially uniform error bit level among a plurality of ECC sectors corresponding to the ECC operation unit.

18. A method of manufacturing a memory device, comprising:
forming a memory cell array including a plurality of memory cells that are arranged in a plurality of vertical channels extended in a vertical direction with respect to a substrate, wherein the plurality of memory cells includes a plurality of cell groups based on cell characteristics, and memory cells of each cell group having the same cell characteristics, and wherein data of the plurality of memory cells are distributed among a plurality of error check and correction (ECC) sectors, in which each ECC sector corresponds to an ECC operation unit having N bits from N memory cells of the memory device, and in which the ECC operation unit is configured to execute an ECC algorithm on the N bits.

* * * * *

UNITED STATES PATENT AND TRADEMARK OFFICE
CERTIFICATE OF CORRECTION

PATENT NO. : 10,067,825 B2
APPLICATION NO. : 15/061349
DATED : September 4, 2018
INVENTOR(S) : Jae-Woo Im and Sang-Hyun Joo Page 1 of 1

It is certified that error appears in the above-identified patent and that said Letters Patent is hereby corrected as shown below:

In FIG. 7, "BLo" should read --BLi--; and

In FIG. 7, "BLi" should read --BLo--.

Signed and Sealed this
Fourth Day of December, 2018

Andrei Iancu
*Director of the United States Patent and Trademark Office*